(12) United States Patent
Osuch et al.

(10) Patent No.: US 10,911,025 B2
(45) Date of Patent: Feb. 2, 2021

(54) SECOND-ORDER ALL-PASS NETWORK COMPRISING CCIIS

(71) Applicant: University of Pretoria, Pretoria (ZA)

(72) Inventors: Piotr Jan Osuch, Pretoria (ZA); Tinus Stander, Pretoria (ZA)

(73) Assignee: University of Pretoria, Pretoria (ZA)

( * ) Notice: Subject to any disclaimer, the term of this patent is extended or adjusted under 35 U.S.C. 154(b) by 0 days.

(21) Appl. No.: 16/760,967

(22) PCT Filed: Nov. 7, 2018

(86) PCT No.: PCT/IB2018/058738
§ 371 (c)(1),
(2) Date: May 1, 2020

(87) PCT Pub. No.: WO2019/092605
PCT Pub. Date: May 16, 2019

(65) Prior Publication Data
US 2020/0304105 A1     Sep. 24, 2020

(30) Foreign Application Priority Data
Nov. 7, 2017 (ZA) .................................. 2017/07512

(51) Int. Cl.
*H03H 11/02* (2006.01)

(52) U.S. Cl.
CPC .................. *H03H 11/025* (2013.01)

(58) Field of Classification Search
None
See application file for complete search history.

(56) References Cited

U.S. PATENT DOCUMENTS

| 5,124,666 A | 6/1992 | Liu et al. |
| 8,368,464 B2 * | 2/2013 | Abuelma'atti ......... H03H 11/32 330/69 |

OTHER PUBLICATIONS

Acar C., "Nth-order allpass voltage transfer function synthesis using CCII+s: Signal-flow graph approach," Electronics LET, Apr. 11, 1996, pp. 727-729, vol. 32, No. 8.

Horng, Jiun-Wei, "High-Input Impedance Voltage-Mode Universal Biquadratic Filter Using Three Plus-Type CCIIs," IEEE Transactions on Circuits and Systems II: Analog and Digitalsignal Processing, Institute of Electrical and Electronics Engineers, Inc., Oct. 2001, pp. 996-997, vol. 48, No. 10.

(Continued)

*Primary Examiner* — Jeffery S Zweizig
(74) *Attorney, Agent, or Firm* — McDonnell Boehnen Hulbert & Berghoff LLP

(57) ABSTRACT

A second-order all-pass network has at least three Second Generation Current Conveyors (CCIIs). A network input is connected or connectable to a Y port of a first CCII, a Z port of the first CCII is connected to a Y port of a second CCII, an X port of the first CCII is connected to a Y port of a third CCII, and a network output is connected or connectable, directly or indirectly, to a Z port of the second CCII. The X port of the first CCII is connected via a first network element to ground, the Z port of the first CCII is connected via a second network element to ground, an X port of the third CCII is connected via a third network element to ground, and an X port of the second CCII is connected via a fourth network element to ground.

21 Claims, 17 Drawing Sheets

(56) References Cited

OTHER PUBLICATIONS

Horng et al., "Voltage-mode universal biquadratic filters with one input and five outputs using MOCCIIs," Computers & Electrical Engineering, pp. 190-202, May 2005, vol. 31, No. 3.
Pal, K., "All-pass networks using current conveyors," Microelectronics Journal, Jun. 1991, pp. 53-56, vol. 22, No. 4.
Toker et al., "Direct synthesis approach for voltage mode transfer functions using current conveyors," IEEE APCCAS 1998, 1998 IEEE Asia-Pacific Conference on Circuits and Systems, Microelectronics and Integrating Systems Proceedings, 1998, pp. 255-258.
International Searcing Authority, International Search Report and Written Opinion, dated Feb. 18, 2019, issued in connection with International Patent Application No. PCT/IB2018/058938, 12 pages.

* cited by examiner

SECOND-ORDER ALL-PASS NETWORK COMPRISING CCIIS

FIELD OF INVENTION

This invention relates generally to analogue electronic circuits and specifically to a second-order all-pass network comprising CCIIs.

BACKGROUND OF INVENTION

The Applicant notes that analogue signal processing (ASP) is a promising alternative to digital signal processing (DSP) techniques in future high-speed telecommunication and data-processing solutions, as analogue devices outperform their digital counterparts in terms of cost, power consumption, and the maximum attainable bandwidth [1]. A fundamental building block of any ASP is a dispersive delay structure (DDS) of prescribed response [2], [3]. For example, DDSs with non-constant linear group delays are used for real-time Fourier transformation, stepped group delays for distortionless frequency discrimination, and Chebyshev delays for distortion-encoding multiple-access communication channels [3]. Any of these dispersive responses can be synthesized by cascaded first- and second-order all-pass networks (as is shown in [4]), with the former being a special case of the latter. In addition, all-pass networks can be used to equalize the group delay response of various other transceiver components (such as antennas, filters and amplifiers) to minimize signal distortion [5], easing the burden on the system DSP.

In practically implementing a first- or second-order all-pass network [1], [3], [5]-[31], a trade-off is made between the maximum achievable all-pass delay ($\Delta\tau$) and the insertion loss of the network at the resonant frequency. The delay Q-value, defined as $Q=\Delta\tau \cdot \omega_0/4$ (where $\omega_0$ is the peak delay frequency) is used as a figure of merit to gauge the maximum achievable $\Delta\tau$ independent of $\omega_0$. A Q-value larger than 1 is required for many ASP applications [2]. In off-chip media, microwave DDSs have been proposed that are comprised of cascaded microwave C-sections with tunable lumped elements [1], [3]. These have been shown to exhibit bandwidths of approximately 4 GHz [1] and 15 GHz [5], with acceptable insertion loss and delay Q-values larger than 1. However, the high losses of on-chip distributed line elements make these approaches infeasible on-chip [32]. Similarly, passive lumped element configurations on-chip are also vulnerable to resonant loss, due to low attainable inductor Q-factors (not the same as delay Q-values) of typically less than 10 [7], [23], [24], [27]. In [23] an approximation to a second-order all-pass network is proposed based on a single transistor inverter. This design uses an on-chip inductor achieving a delay Q-value of only 0.08. In [24] an analogue two transistor delay circuit using an on-chip inductor achieves a Q-value of only 0.047. Similarly, in [27] a simple Padé approximation is implemented achieving a Q-value 0.049. In recognition of this, numerous active inductorless implementations of all-pass networks have been proposed [25], [26], [28], [30], [31]. In [25] an active inductorless approximation to a second-order all-pass network is proposed based on a CMOS inverter, and achieves a Q-value of 0.19. In [26] an LC network is implemented by using an active inductor, approximating a second-order delay response with an overall delay Q-value of 0.071. In [28], [30], [31] a special case of a second-order delay network is obtained with the resonant frequency at 0 Hz and therefore a Q-value of 0. To avoid an approximation to an ideal second-order all-pass response and to increase the achievable Q-value, operational amplifier and CCII-based realizations have been proposed [8]-[22] which can potentially achieve Q-values larger than 1. Op-amp based realizations are generally undesirable due to low bandwidths [9], sparking interest in CCII-based implementations.

In broad terms, Current Conveyors (CCs) and Second Generation Current Conveyors (CCIIs) are known in the electronic arts (http://en.wikipedia.org/wiki/Current_conveyor, accessed 5 Jun. 2017). Since the introduction of the CCII in the 1970s, it has proven to be a versatile building block in analogue electronic design. A CCII is a three-port network defined by the hybrid matrix:

$$\begin{bmatrix} I_Y \\ V_X \\ I_Z \end{bmatrix} = \begin{bmatrix} Y_Y & 0 & 0 \\ \beta & Z_X & 0 \\ 0 & \alpha & Y_Z \end{bmatrix} \begin{bmatrix} V_Y \\ I_X \\ V_Z \end{bmatrix}, \quad (1)$$

where $\beta$ and $\alpha$ represent the voltage and current transfer ratios respectively, $Y_Y$ the admittance at port Y, $Z_X$ the impedance at port X and $Y_Z$ the admittance at port Z. It is desirable in many applications to minimise the deviation of $\beta$ and $\alpha$ from unity (here referred to as the transfer error), minimise $R_X$ and maximise $R_Z$ and $R_Y$ (the resistive components of $Z_X$, $Y_Z$ and $Y_Y$ respectively) for some desired bandwidth.

These devices exhibit higher bandwidth, greater linearity and lower power consumption than op-amps, making them better suited for implementation of second-order all-pass networks [8]-[22].

However, CCII non-idealities such as non-unity voltage mirroring ($A_v$) and current conveying ($A_i$), non-zero input resistance at port X ($R_X$), and finite values of output resistance at ports Y and Z ($R_Y$ and $R_Z$) make many of these designs impractical, even when using high-precision CCIIs [33]. This shortcoming has, however, never been addressed in literature, as most papers assume ideal CCII elements. For example, implementing the all-pass network in [8] using a CCII with an $R_X$ of 5Ω and a 2% deviation in $A_v$ results in a ~3 dB magnitude peak at resonance, whereas a similar deviation in $A_i$ results in a ~2 dB notch. An $R_X$ of 10Ω results in an even larger 8 dB magnitude notch. It is, therefore, crucial to practical on-chip implementation to use all-pass circuits which can account for the above CCII non-idealities through appropriate selection of RC components. Furthermore, since both the CCII parameters and the RC components themselves change with process parameter variation, post-production tunability of the circuit is also necessary.

In this present invention, the synthesis approach presented in [12], based on partial fraction decomposition, is applied to the general CCII configuration in [13] to synthesize an inductorless second-order all-pass network. The proposed network can be tuned post-production to concurrently account for non-unity Av and Ai, as well as, to a certain extent, a non-zero RX, which is a unique contribution to the state-of-the-art. The proposed design is implemented in the 0.35 μm CMOS technology node using CCIIs based on [34], with the surrounding RC network implemented in the form of varactors and NMOS transistors operating in the triode region to provide post-production tunability. A post-production automated tuning method is further proposed, whereby measured data from a VNA is used in a real-time genetic local optimizer on a PC (which controls various bias voltages using a DAC card) to tune the physical all-pass network. It is shown that this step is crucial to realizing a practical system, leading to the first ever measured results of an active inductorless on-chip CMOS second-order all-pass network with a delay Q-value larger than 1.

SUMMARY OF INVENTION

A second-order all-pass network comprising:
at least three CCIIs, namely a first CCII, a second CCII, and a third CCII, wherein:
  a network input is connected or connectable to a Y port of the first CCII;
  a Z port of the first CCII is connected to a Y port of the second CCII;
  an X port of the first CCII is connected to a Y port of the third CCII; and
  a network output is connected or connectable, directly or indirectly, to a Z port of the second CCII, and
a plurality of network elements, wherein:
  the X port of the first CCII is connected via a first network element to ground;
  the Z port of the first CCII is connected via a second network element to ground;
  an X port of the third CCII is connected via a third network element to ground; and
  an X port of the second CCII is connected via a fourth network element to ground.

The all-pass network may be inductorless.
The all-pass network may have a Q-value larger than 1.
The Y port of the second CCII may be connected to the Z port of the second CCII. The Y port of the third CCII may be connected to the Z port of the third CCII.

One or more of the network elements may be an RC (Resistor-Capacitor) network. The RC network may be a parallel RC network or a series RC network. The resistor component in the RC network may be implemented by an NMOS transistor. The capacitor component in the RC network may be implemented by a varactor. The RC network comprising an NMOS transistor and/or varactor may be operated in a triode region, which may provide post-production tunability. The network elements may be tunable iteratively.

The all-pass network may be implemented in a CMOS process. The CMOS process may be a 0.35 µm CMOS process, e.g., using the AMS AG 0.35 µm CMOS process. The network elements (if present) may be on-chip. The tunability of the network elements (if present) may compensate for CMOS process tolerances.

The all-pass network may be used in conjunction with a CCII tunable network. The CCII tunable network may be as described in ZA2017/05760. This may provide magnitude peaking post-production tunability.

The second-order all-pass network may include a fourth CCII configured for post-production tunability. A Y port of the fourth CCII may be connected to the Z port of the second CCII. A Z port of the fourth CCII may be connected or connectable to the network output (the Z port of the third CCII thus being indirectly connected to the network output via the fourth CCII). An X port of the fourth CCII may be connected to the Z port of the fourth CCII.

The invention extends to a method of tuning the second-order all-pass network as defined above. Tuning the all-pass network may include automatic tuning. One or more of the network elements may be tunable. Automatic tuning may include use of an optimiser algorithm. Tuning the all-pass network may include automatic tuning of one or more of the network elements by the algorithm, collectively or independently. Automatic tuning may include iterative tuning passes.

BRIEF DESCRIPTION OF DRAWINGS

The invention will now be further described, by way of example, with reference to the accompanying diagrammatic drawings.

In the drawings.

DETAILED DESCRIPTION OF EXAMPLE EMBODIMENT

The following description of the invention is provided as an enabling teaching of the invention. Those skilled in the relevant art will recognise that many changes can be made to the embodiment described, while still attaining the beneficial results of the present invention. It will also be apparent that some of the desired benefits of the present invention can be attained by selecting some of the features of the present invention without utilising other features. Accordingly, those skilled in the art will recognise that modifications and adaptations to the present invention are possible and can even be desirable in certain circumstances, and are a part of the present invention. Thus, the following description is provided as illustrative of the principles of the present invention and not a limitation thereof.

Figure 1:
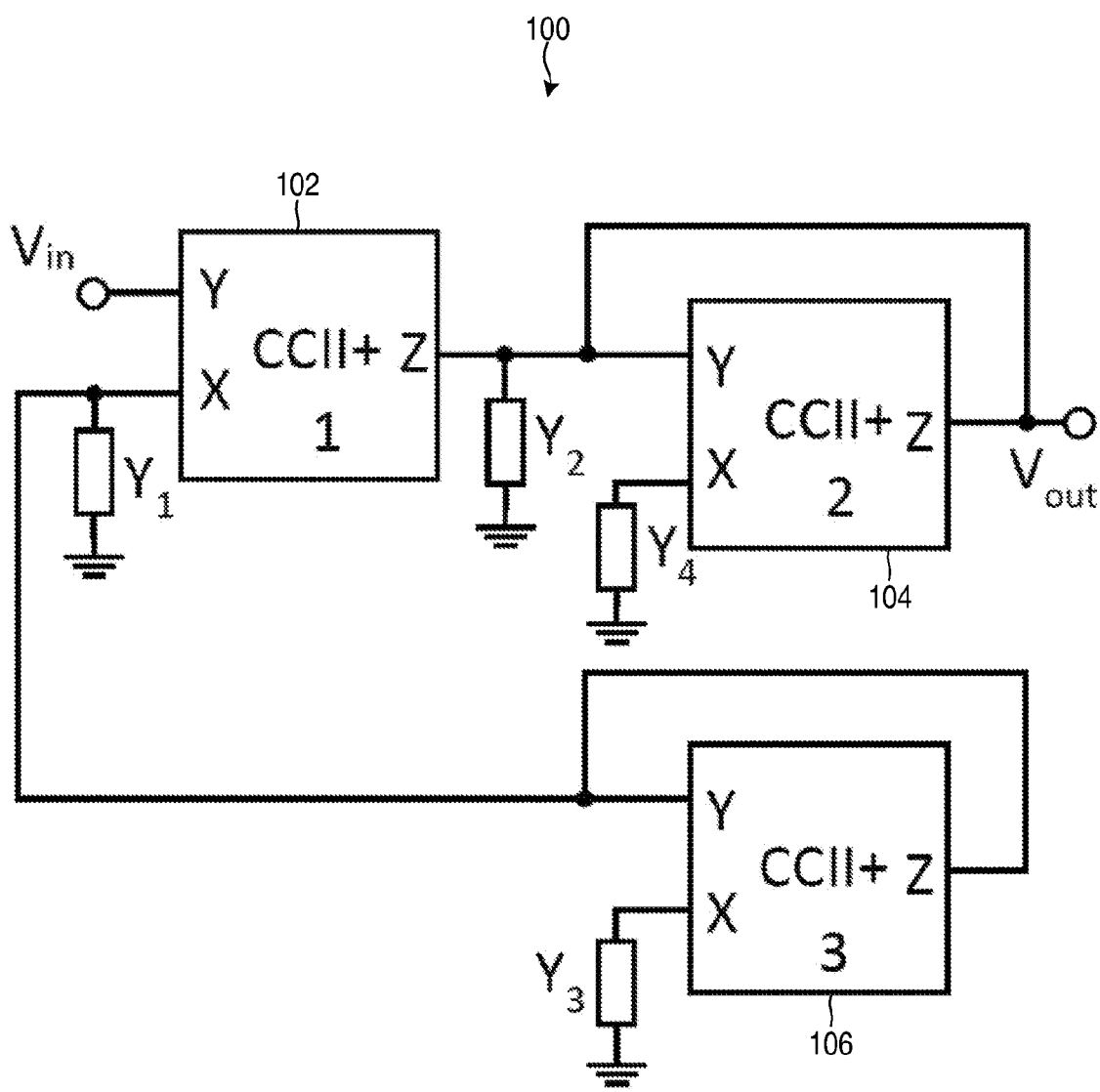
FIG. 1 shows a first embodiment of a second-order all-pass network comprising CCIIs, in accordance with the invention.

FIG. 1 illustrates a second-order all-pass network 100, in accordance with the invention. The all-pass network 100 comprises three CCIIs 102, 104, 106 and realises a generalized second-order transfer function. The components designated by $Y_1$-$Y_4$ are network elements as described below. The transfer function, considering non-unity Ai and Av, is:

$$\frac{V_o}{V_i} = \frac{A_i A_v \cdot [Y_1 - Y_3 \cdot A_i A_v]}{Y_2 - Y_4 \cdot A_i A_v}. \tag{1}$$

A desired second-order all-pass transfer function can be written as:

$$\frac{V_o}{V_i} = \frac{s_n^2 - s_n/Q + 1}{s_n^2 + s_n/Q + 1} = \frac{Y_N}{Y_D} \tag{2}$$

where $s_n = s/\omega_0$, $Q = \Delta\tau \cdot \omega_0/4$, $\omega_0 = 2\pi f_0$ is a centre frequency of the second-order all-pass delay function, and $\Delta\tau$ is the corresponding peak-to-nominal group delay. Following the approach in [12], equation (2) can be written as:

$$\frac{Y_N}{s_n(s_n+1)} = \frac{s_n^2 - s_n/Q + 1}{s_n(s_n+1)}. \tag{3}$$

After division and partial fraction decomposition, this becomes $$\frac{Y_N}{s_n+1} = s_n + 1 - \frac{s_n(2+1/Q)}{s_n+1}. \tag{4}$$

Similarly, for the denominator $$\frac{Y_D}{s_n+1} = s_n + 1 - \frac{s_n(2-1/Q)}{s_n+1}. \tag{5}$$

Equating terms in (4) and (5) with (1) and introducing a real scaling constant α, the following set of equations can be derived:

$$A_i A_v Y_1 = (s_n + 1)\alpha, \tag{6}$$

$$Y_2 = (s_n + 1)\alpha, \tag{7}$$

$$A_i^2 A_v^2 Y_3 = \frac{s_n \alpha(2 + 1/Q)}{s_n + 1}, \tag{8}$$

$$Y_4 A_i A_v = \frac{s_n \alpha(2 - 1/Q)}{s_n + 1}. \tag{9}$$

$Y_1$ and $Y_2$ can be realized as a parallel RC network, and $Y_3$ and $Y_4$ as a series RC network, with:

$$R_1 = \frac{A_i A_v}{\alpha}, C_1 = \frac{\alpha}{A_i A_v \omega_0}, \tag{10}$$

$$R_2 = \frac{1}{\alpha}, C_2 = \frac{\alpha}{\omega_0}, \tag{10}$$

$$R_3 = \frac{A_i^2 A_v^2}{\alpha(2+1/Q)}, C_3 = \frac{\alpha(2+1/Q)}{\omega_0 A_i^2 A_v^2}, \tag{10}$$

$$R_4 = \frac{A_i A_v}{\alpha(2-1/Q)}, C_4 = \frac{\alpha(2-1/Q)}{\omega_0 A_i A_v}, \tag{10}$$

where the subscripts of each network element Y correspond to those of the R and C components.

In the preceding derivation, CCII non-idealities other than $A_i$ and $A_v$ (specifically the critical parameter $R_X$) are not considered, since equating terms in (4) and (5) with (1) then becomes impossible without applying an approximation. It is evident in FIG. 1 that $R_X$ of both the $2^{nd}$ and $3^{rd}$ CCIIs 104, 106 can be incorporated into the series $R_4$ and $R_3$, respectively, thus effectively compensating for its non-ideal effect. Perfect compensation for $R_X$ in the $1^{st}$ CCII 102 is not possible; however, this may not be necessary for many practical cases ($R_X<30\Omega$).

Next, the effects that CCII non-idealities have on the proposed design, as well as on other all-pass networks in the literature [8], [14], [15], [17]-[21], are investigated and compared. In each case, the transfer function of the all-pass network is derived, including the effect of the non-ideal constituent CCII parameters, and the numerical transfer response computed for variable values of different CCII non-idealities. In all cases, identical non-ideality is assumed for all CCIIs in the second-order network, with only one non-ideality swept at a time.

It may also be important to consider in this comparison to what degree the synthesis of the network (selection of R and C values) can be adapted to a priori known CC II non-idealities. It is evident from their respective transfer functions that non-ideal Ai can be compensated for in this work, as well as in [8], [14], [18], [19], [21] through appropriate selection of R and C values. Similarly, non-ideal $A_v$ can be compensated for and in [20] and $R_X$ in circuits [18]-[21]. In most or all cases, $R_Z$ and $R_Y$ cannot be perfectly compensated, but this is often not necessary for practical cases.

From each numerical transmission response calculation over frequency, two performance metrics are extracted. These are the magnitude response variation ($\Delta|H|$) and the group delay similarity, defined as:

$$\tau_s = \int_0^{2\omega_0} |\tau_{ideal} - \tau_{net}| d\omega / \int_0^{2\omega_0} |\tau_{ideal}| d\omega, \tag{11}$$

where $\tau_{ideal}$ is the delay response with ideal CCIIs and $\tau_{net}$ the non-ideal network response. A $\tau_s=0$ indicates that the two responses are identical whereas a $\tau_s>0$ indicates dissimilarity between the group delays. This definition captures both $\Delta\tau$ and $\omega_0$ deviations, as well as deviations from the ideal group delay curve shape. This is important to consider, as CCII non-idealities can disrupt a response of the all-pass network 100 to such an extent that the network's delay no longer resembles that of a second-order all-pass network. Finally, as all the considered networks are underdetermined (fewer bounding equations than R and C unknowns), the following component choices are made to ensure a fair comparison between the circuits, as shown in TABLE 1. In all cases $C_1 = C_2 = C$.

TABLE 1 component choices for inter-circuit comparison.

| All-pass network | Imposed conditions | Design eq. 1 | Design eq. 2 | Design eq. 3 |
|---|---|---|---|---|
| [14] | $R_2 = R_3 = R_4 = R$ | $R_2 = \beta$ | $R_1 = \beta/(Q^2 A_i)$ | $C = (A_i^2 Q/(\omega_0 \beta)$ |
| [15] | — | $R_1 = \beta$ | $R_2 = \beta/Q^2$ | $C = Q/(\omega_0 \beta)$ |
| [17] | $R_1 = R_2$ | $R_1 = \beta$ | $R_3 = \beta/Q^2$ | $C = Q/(\omega_0 \beta)$ |
| [18] | — | $R_1 = \beta$ | $R_2 = A_i \beta/Q^2$ | $C = Q/(\omega_0 \beta)$ |
| [19] | $R_2 = R_3$ | $R_1 = \beta$ | $R_2 = A_i \beta/Q$ | $C = Q/(\omega_0 \beta)$ |
| [20] | $R_2 = 2R_3$ | $R_3 = \beta$ | $R_1 = 4 \beta/Q^2$ | $C = Q/(2\omega_0 \beta)$ |
| [21] | $R_2 = R_3$ | $R_1 = \beta$ | $R_2 = A_i \beta/Q$ | $C = Q/(\omega_0 \beta)$ |

The value for $\beta$ is chosen as $10^3$ (as this leads to a realisable resistance on-chip), Q is set as 2 and $\omega_0$ as $2.\pi.200.10^6$ (corresponding to design choices explained later). It is, however, reasonable to expect the general conclusions using these parameters to hold for other design choices as well.

For the all-pass network 100, as well as the network in [8], the design choices $C_1=\alpha/\omega_0$, $C_2=(2+1/Q)/\omega_0$, $C_3=2\alpha/\omega_0 Q$, $R_1=1/\alpha$, $R_2=1/(\alpha\cdot(2+1/Q))$, and $R_3=Q/2\alpha$ are made. In both cases $\alpha$ is chosen as $10^{-3}$, to ensure agreement to the component values in TABLE 1 for the other networks.

FIGS. 2a-2j show $\Delta|H|$ and $\tau$s over the various CCII non-idealities. In each sub-figure, the solid curve represents the best-case response, where all the non-idealities are known beforehand and compensated for (if possible) in the selection of R and C values. The dotted curves on the other hand represent the response without any compensation for non-idealities (even if compensation is possible).

Figure 2A:
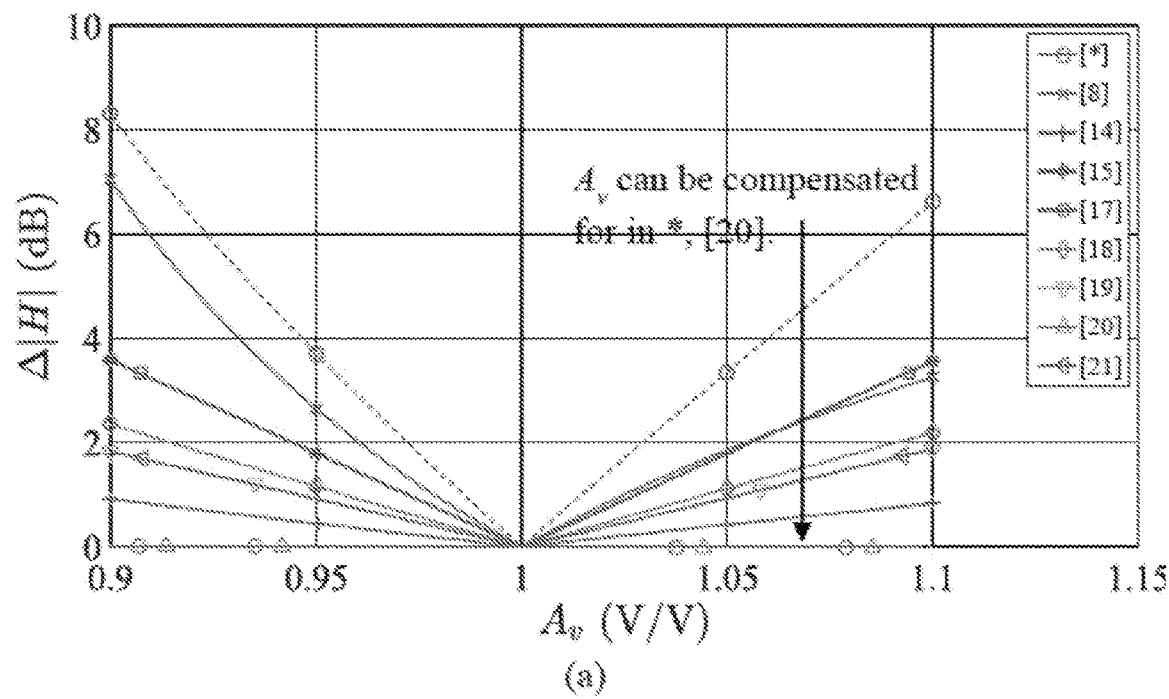
FIGS. 2a-2j show graphs of response characteristics of various effects of CCII non-idealities on the second-order all-pass network of FIG. 1: (a) non-unity $A_v$ vs. $\Delta|H|$, (b) non-unity $A_v$ vs. r, (c) non-unity $A_i$ vs. $\Delta|H|$, (d) non-unity $A_i$ vs. $\tau_s$, (e) non-zero $R_X$ vs. $\Delta|H|$, (f) non-zero $R_X$ vs. $\tau_s$, (g) finite $R_Z$ vs. $\Delta|H|$, (h) finite $R_Z$ vs. $\tau_s$, (i) finite $R_Y$ vs. $\Delta|H|$, (j) finite $R_Y$ vs. $\tau_s$, with the asterisk (*) denotes the all-pass network of FIG. 1. In all cases the solid curve represents the best-case response, where all the non-idealities are known beforehand and compensated for (if possible) in the selection of R and C values. The dotted curves on the other hand represent the response without any compensation for non-idealities (even if compensation is possible)
Figure 2B:
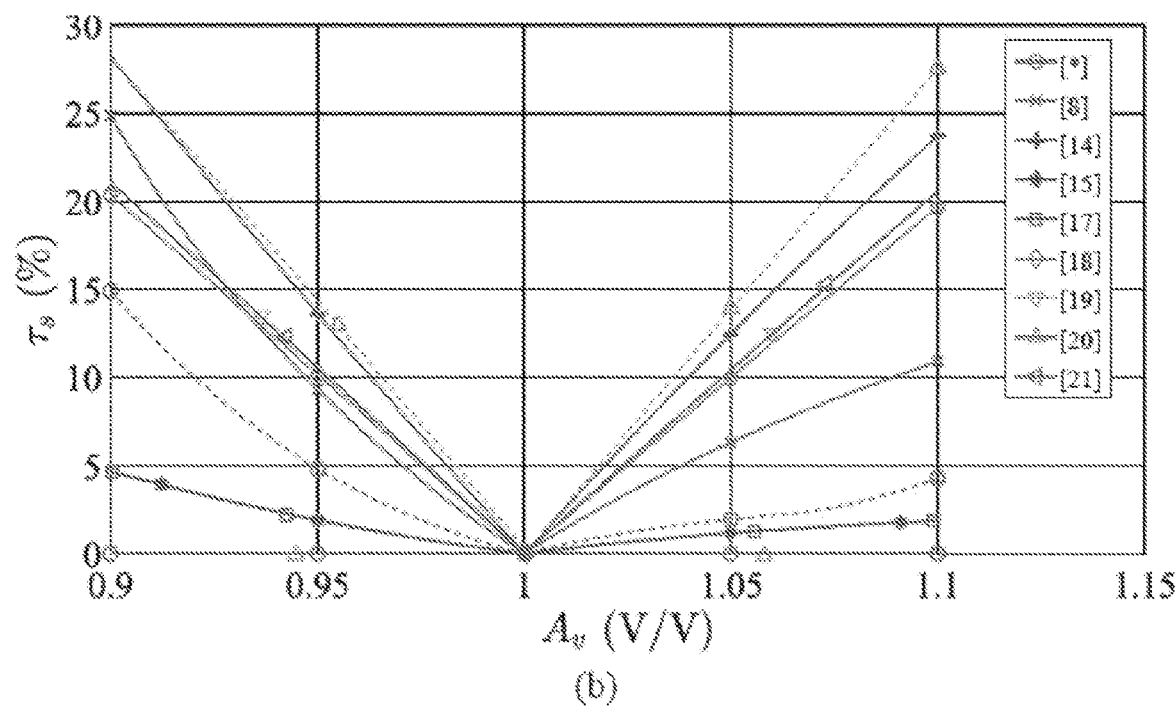

From FIGS. 2a-2b, it can be seen that the proposed network 100 and the design in [20] are the only designs in which $A_v$ can be compensated for. For $\Delta|H|<0.5$ dB, designs [8], [15], [17] require $A_v$ precisions within 1.4% of unity, designs [18], [19], [21] $A_v$ precisions within 2.7% of unity, and design [14] an $A_v$ precision within 6% of unity (making it the design most resilient to CCII $A_v$ variation without explicit compensation applied). Achieving even this level of precision, however, requires a high-precision CCII with feedback control which complicates the design and reduces the achievable bandwidth [33]. This point is further illustrated later with a Monte Carlo analysis.

Figure 2C:
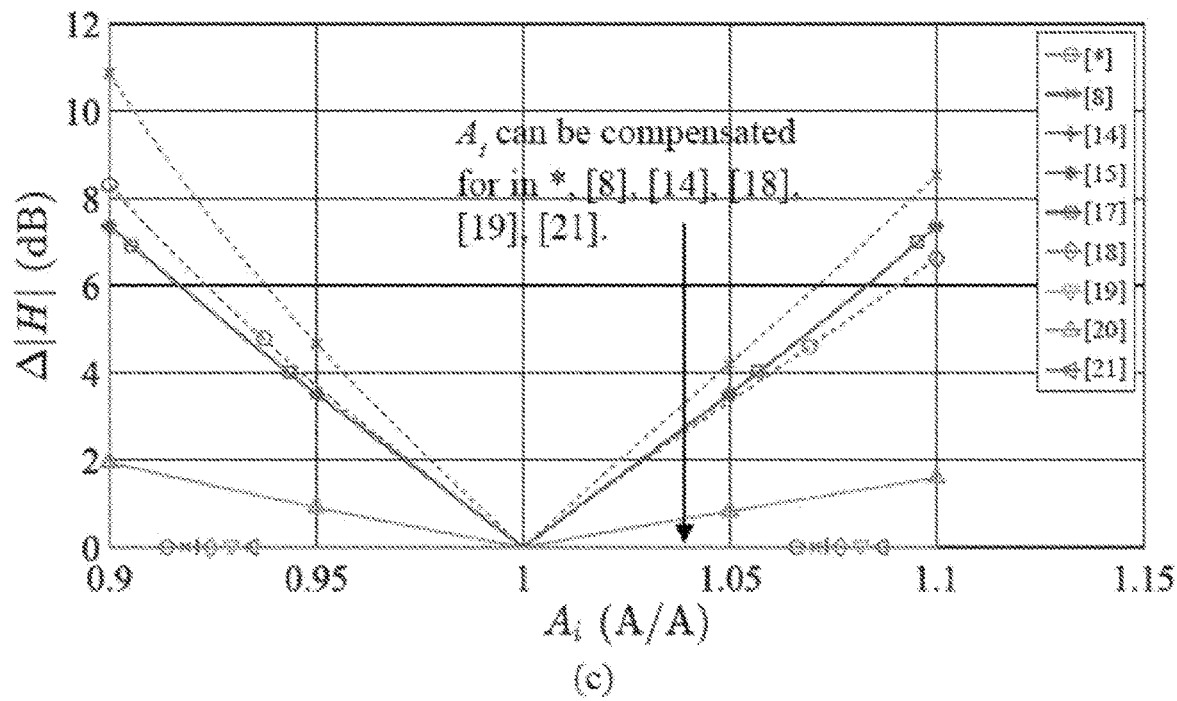
Figure 2D:
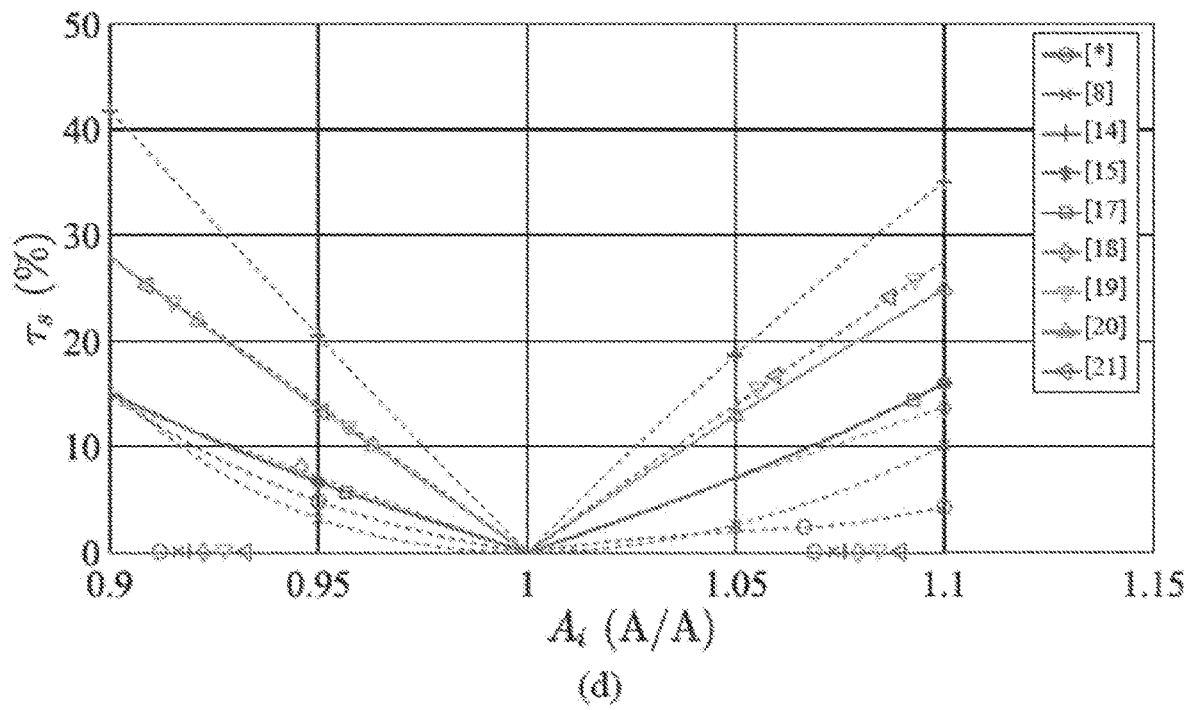

FIGS. 2c-2d show the benefit of the proposed design over the circuit in [20], since it allows for ideal compensation of A variation. In [20], Ai precision within 3% of unity is required for $\Delta|H|<0.5$ dB—a value that is difficult to guarantee with CMOS CCIIs—again illustrated later with a Monte Carlo analysis.

Figure 2E:
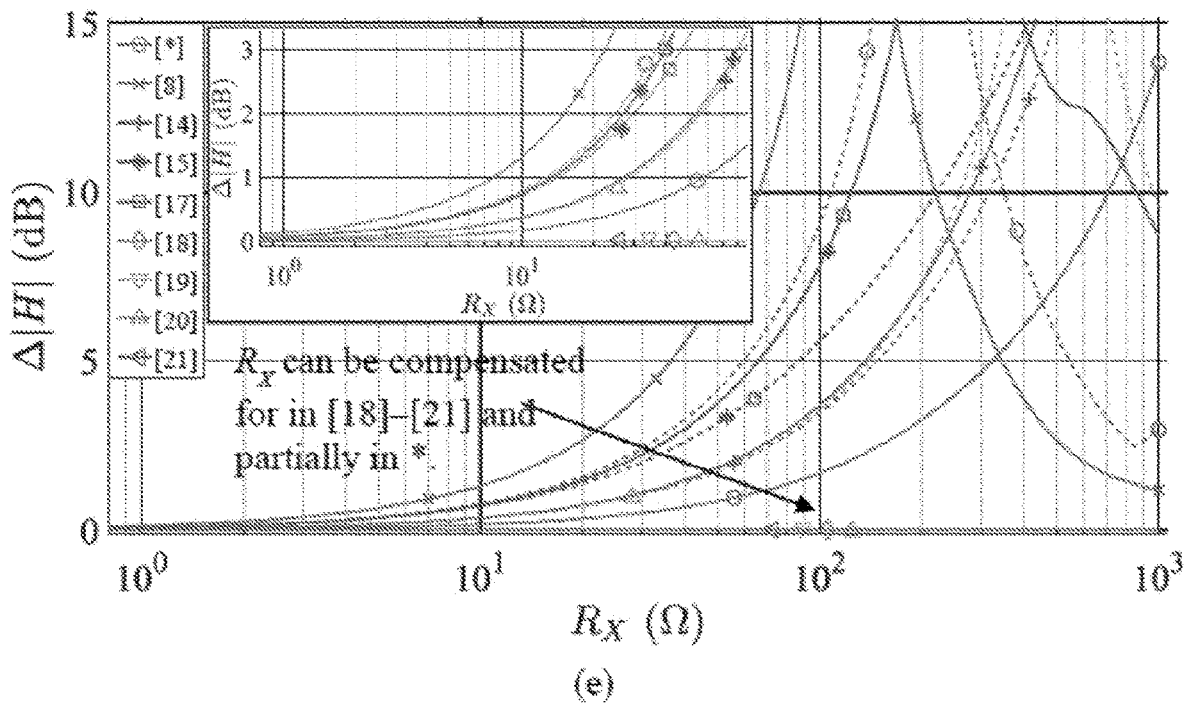
Figure 2F:
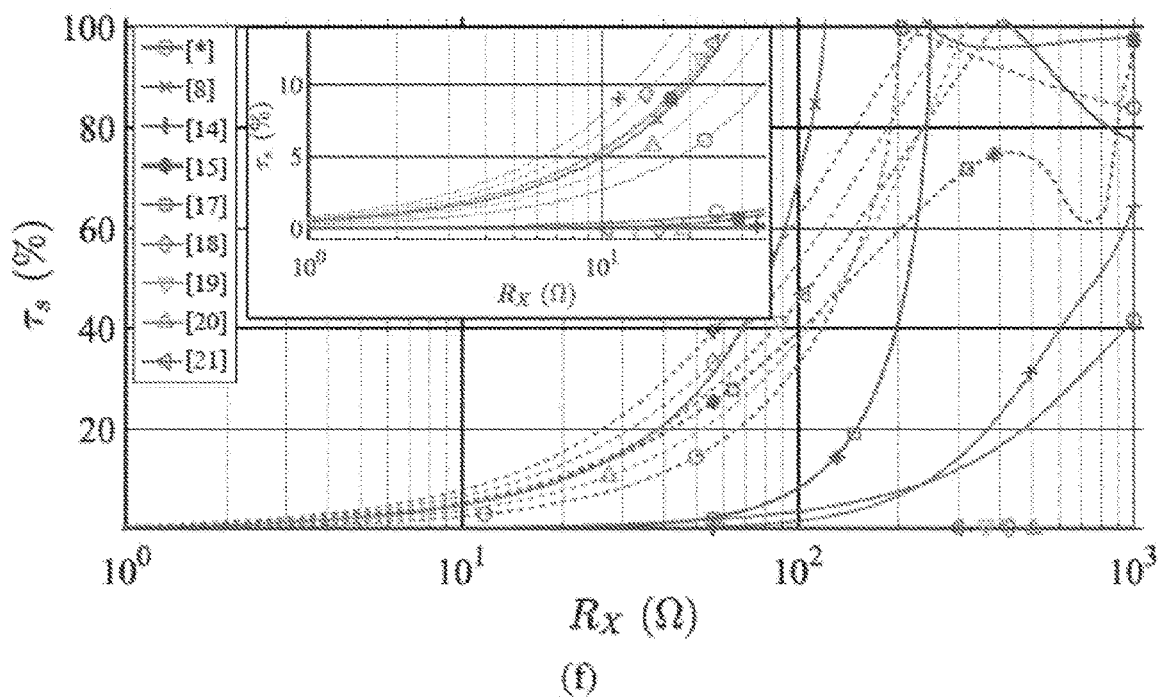

In FIGS. 2e-2f, the proposed design is shown to require $R_X<30\Omega$ for $\Delta|H|<0.5$ dB, which is easily achievable with most CCIIs presented in the literature. In contrast, design [14] requires $R_X<13\Omega$ and design [8] $R_X<4\Omega$ for $\Delta|H|<0.5$ dB. This, again, necessitates high-precision CCIIs. Even though designs [18]-[21] can compensate for non-zero $R_X$, they still require high-precision CCIIs to achieve the required $A_v$ and $A_i$ precisions, as was shown in FIGS. 2a-2b.

Figure 2G:
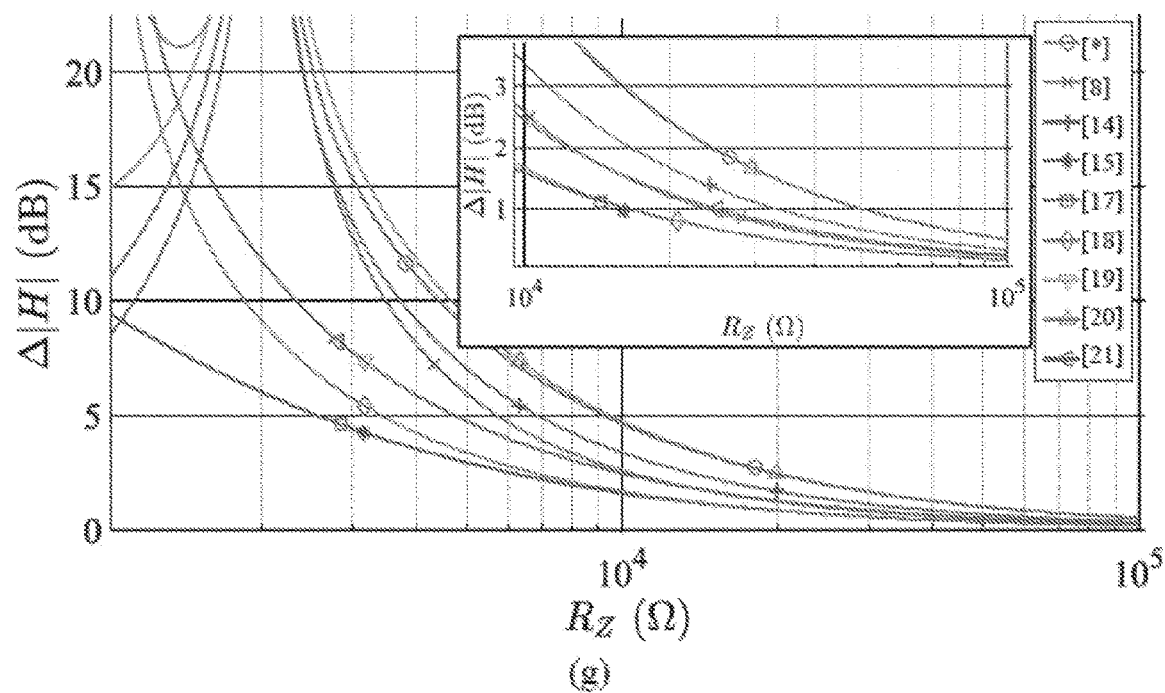
Figure 2H:
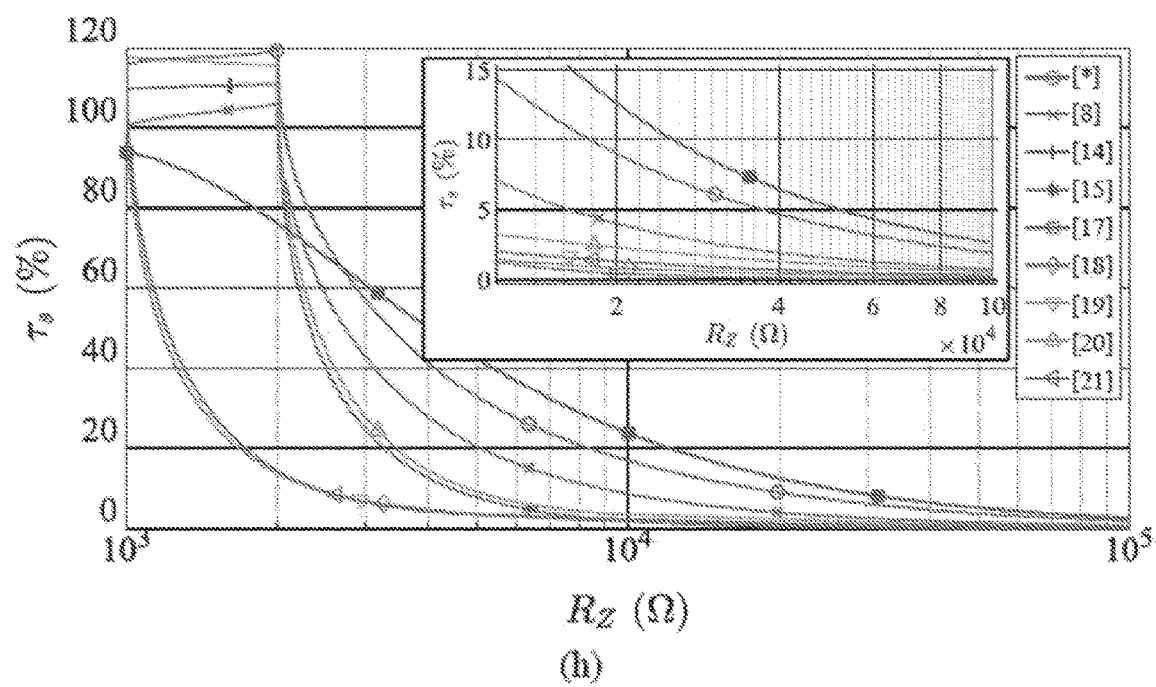

FIGS. 2g-2h indicate that for $\Delta|H|<0.5$ dB, the proposed design requires $R_Z>100$ k$\Omega$, circuit [14] an $R_Z>66$ k$\Omega$, designs [8], [19], [21] an $R_Z>50$ k$\Omega$, and designs [15], [17], [18] an $R_Z>33$ k$\Omega$. An 100 k$\Omega$ can be achieved with a cascode current mirror. Even though current conveying bandwidth is reduced by a low $R_Z$, its effect on CCII bandwidth is much smaller compared to the bandwidth reduction incurred by the feedback required in high-precision CCII designs.

Figure 2I:
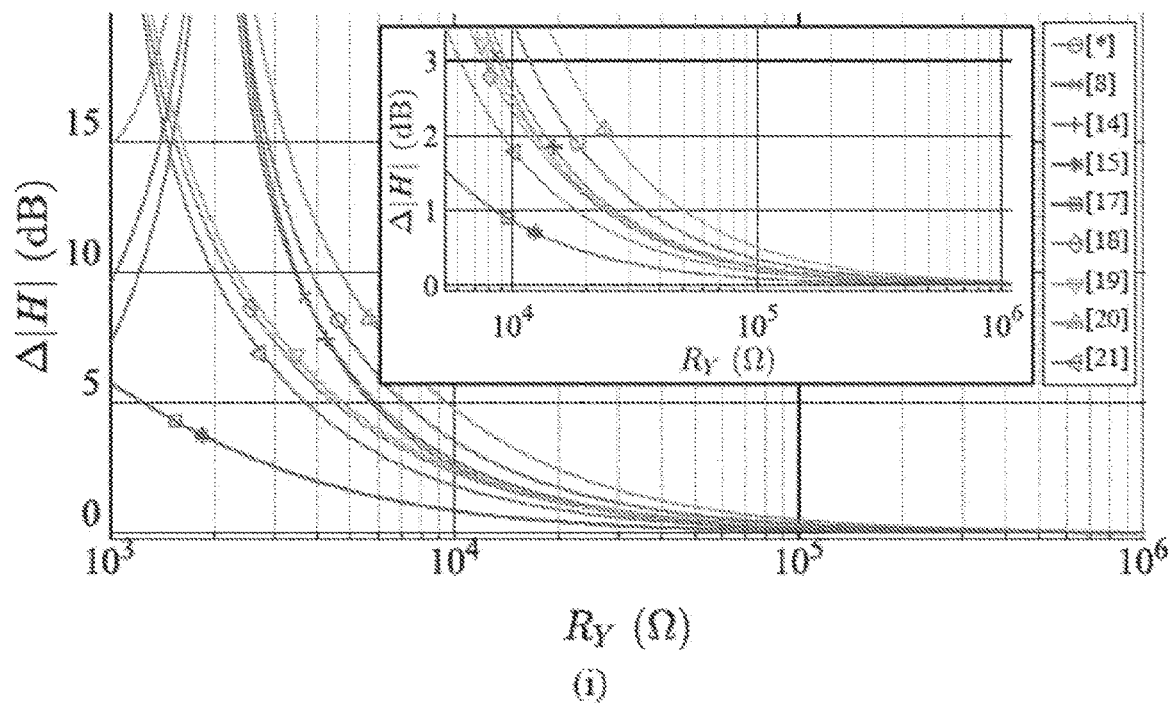
Figure 2J:
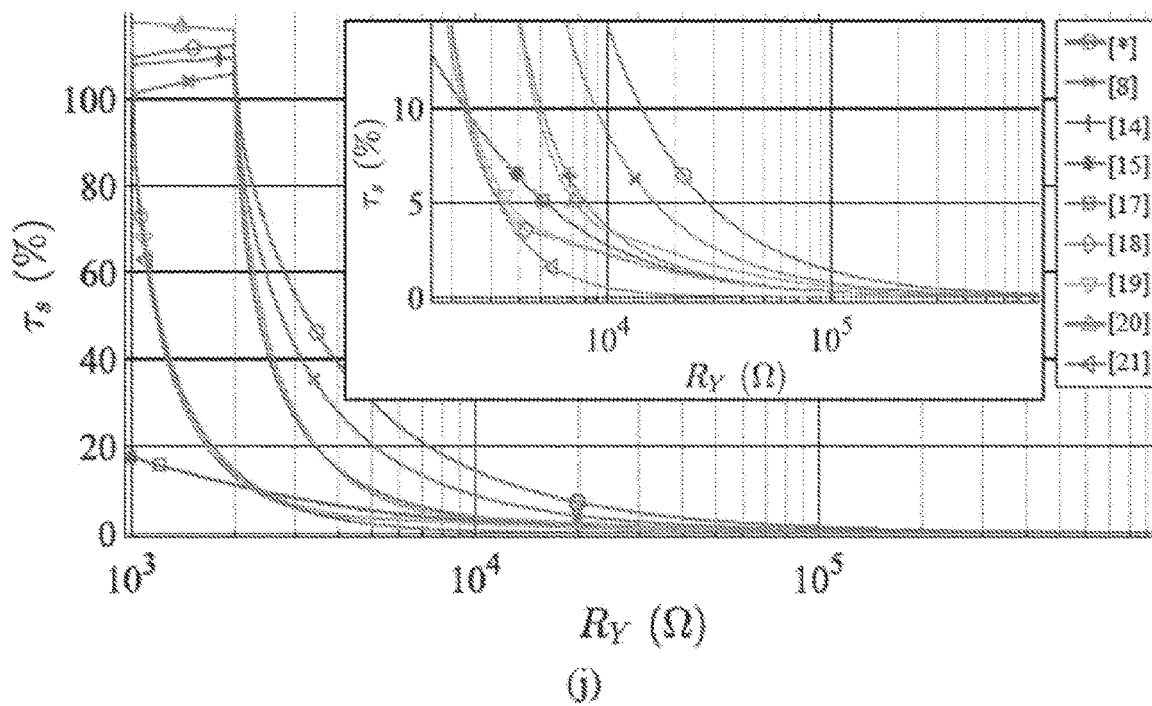

Finally, FIGS. 2i-2j indicate that a $\Delta|H|<0.5$ dB requires $R_Y>100$ k$\Omega$ for all the designs, a value achievable with many CCIIs. Given the ability to compensate for known non-ideal $A_i$ and $A_v$, as well as the acceptable sensitivity to $R_X$, $R_Y$ and $R_Z$ without the need for bandwidth-limiting high-precision CCIIs, the all-pass network 100 is more suitable for second-order delay network implementation than others analysed from literature.

FIGS. 2a-2j also illustrate the importance of post-production tunability of the R and C components to account for a postiori knowledge of CCII non-idealities. This need is exacerbated by other circuit non-idealities not captured by the above analysis, such as process tolerances and parasitic capacitances.

Figure 3:
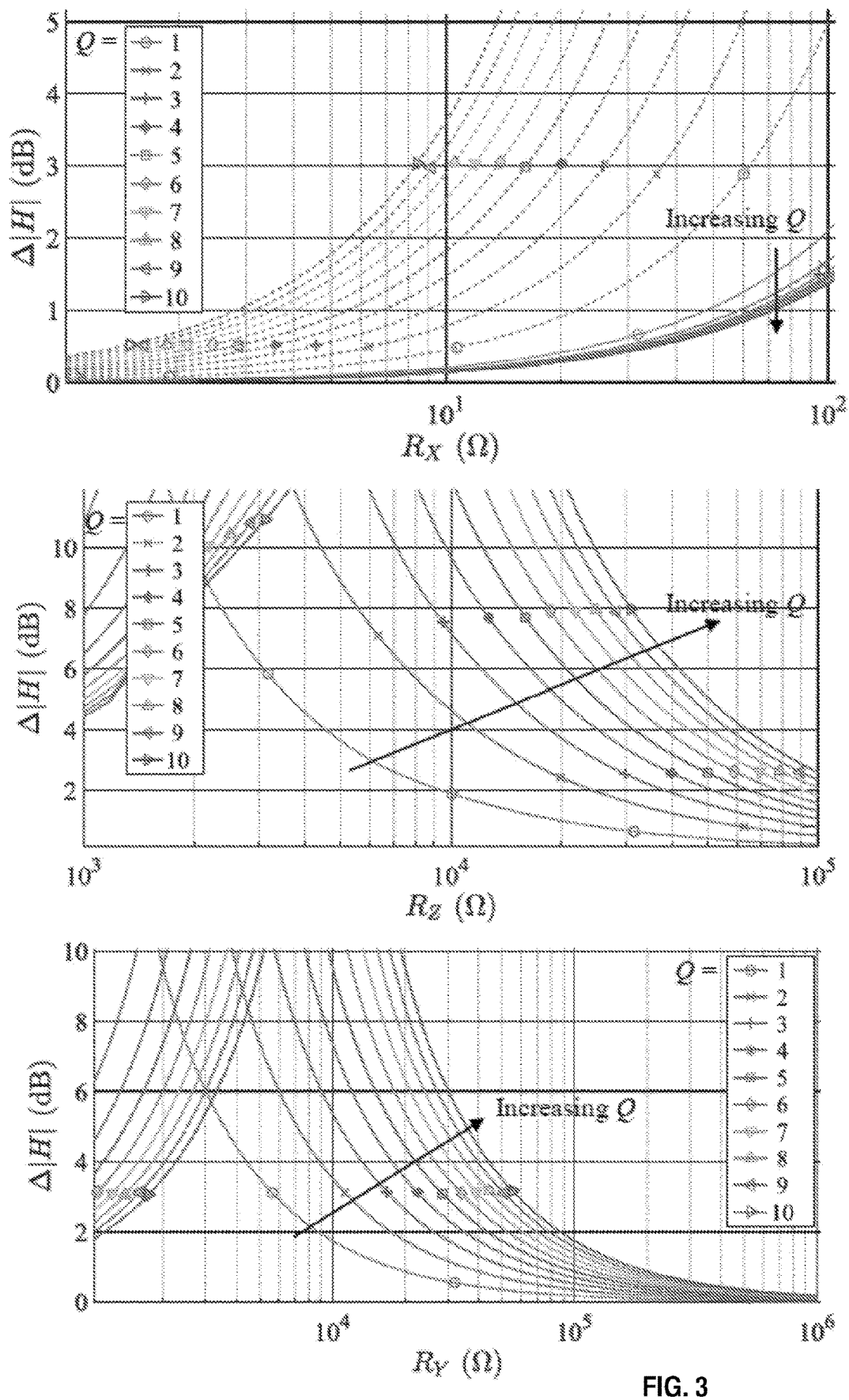
FIG. 3 shows graphs of trade-offs between the delay Q-value of the network of FIG. 1 and $\Delta|H|$ for various CCII $R_X$, $R_Z$ and $R_Y$ non-idealities. The solid curve represents the best-case response, and the dotted curves responses without any compensation for non-idealities (even if compensation is possible)

Finally, the effects of varying Q (and therefore $\Delta\tau$) on the response of the proposed compensated network are shown in FIG. 3, for different values of $R_X$, $R_Y$ and $R_Z$. There is scope for trade-off consideration in the choice of Q given a requirement for $\Delta|H|$ (for instance $R_Y$ can be increased by decreasing the bias current through the current mirror). Such a trade-off, is on the other hand, difficult to achieve in passive soft-substrate designs without the use of active enhancement techniques.

The all-pass network 100 is suitable for monolithic integration in CMOS, e.g., 0.35 µm CMOS technology node. The high-bandwidth, low-$R_X$ CCII presented in [34] with the characteristics $A_i\approx0.976$, $A_v=0.96$, $R_X<20\Omega$, $R_Y=25\Omega$ and $R_Z\approx35$ k$\Omega$ is used as the basis of the CCII design in the all-pass network 100. Even though higher-precision CCIIs have been reported, their design is complicated by necessary stability analyses and compensation networks [33]. Furthermore, the higher precision comes at the expense of lower bandwidth. Non-idealities of the chosen CCII lie within acceptable bounds and a bandwidth-precision trade-off is not necessary. A minimum theoretical magnitude variation of ~2 dB can be achieved after compensation using the all-pass network 100, which is attributed mostly to $R_Y$ and $R_Z$ as per FIGS. 2e-2j. The CCII used in the all-pass network 100 is presented in FIG. 4 with bias currents and transistor aspect ratios as given in TABLE 2.

TABLE 2

Figure 4:
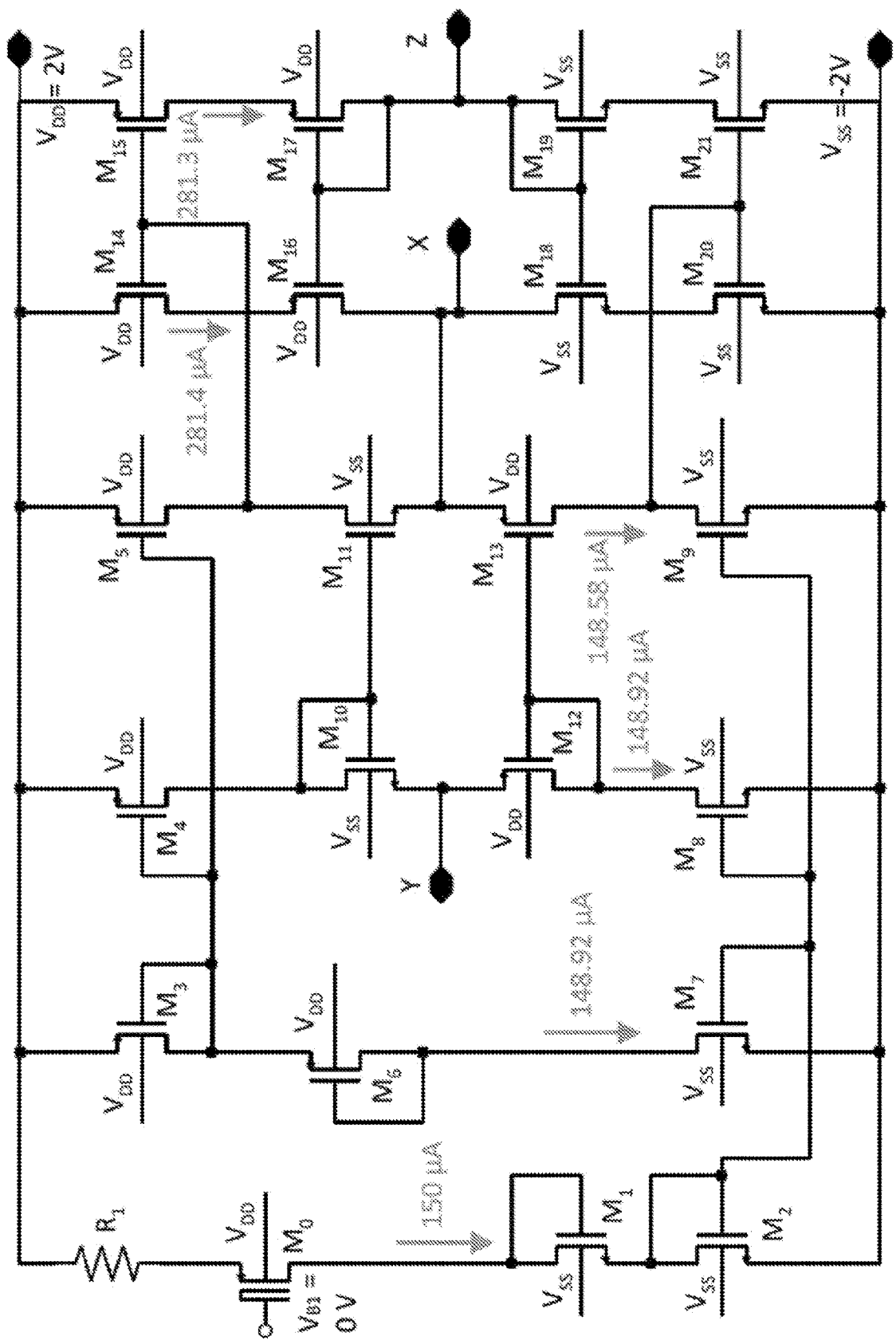
FIG. 4 shows a schematic circuit diagram of a CCII+ used in the all-pass network of FIG. 1.

Transistor sizes chosen for devices in FIG. 4.

| Device | W/L (MM/MM) | Device | W/L (µm/µm) | Device | W/L (µm/µm) |
|---|---|---|---|---|---|
| M0 | 11/0.5 | M8 | 10/1.95 | M16 | 40/0.35 |
| M1 | 10/1.95 | M9 | 10/1.95 | M17 | 40/0.35 |
| M2 | 5/1.95 | M10 | 20/0.35 | M18 | 10/0.35 |
| M3 | 18.9/0.75 | M11 | 20/0.35 | M19 | 10/0.35 |
| M4 | 18.9/0.75 | M12 | 30/0.35 | M20 | 10/0.35 |
| M5 | 18.9/0.75 | M13 | 30/0.35 | M21 | 10/0.35 |

TABLE 2-continued

Transistor sizes chosen for devices in FIG. 4.

| Device | W/L (MM/MM) | Device | W/L (µm/µm) | Device | W/L (µm/µm) |
|---|---|---|---|---|---|
| M6 | 25/1.5 | M14 | 30/0.35 | | |
| M7 | 10/1.95 | M15 | 30/0.35 | | |

Resistor $R_1$ is chosen as 333Ω to ensure an $M_0$ bias current of 150 µA with $V_{B1}$ set to 0 V. To establish a range of possible operating conditions of the CC II, a Monte Carlo analysis is performed on the circuit, leading to the performance characteristic range as shown in TABLE 3.

TABLE 3 performance characteristics of the CCII in FIG. 4.

| Parameter | MEAN | Standard deviation | Minimum | Maximum |
|---|---|---|---|---|
| $A_v$ (V/V) | 1.083 | 9.814 × 10$^{-3}$ | 1.062 | 1.114 |
| $A_i$ (A/A) | 0.992 | 6.306 × 10$^{-3}$ | 0.968 | 1.009 |
| $R_X$ (Ω) | 18.66 | 8.611 | 12 | 161 |
| $R_Z$ (kΩ) | 70 | 26 | 23 | 125 |
| $R_Y$ (kΩ) | 26 | 2.4 | 18 | 30 |

These simulation results agree well with values presented in the literature. Resistance $R_X$ is well within maximum bounds for successful compensation in most scenarios, as only 3% of the simulated 500 samples have $R_X$ of greater than 20Ω and only 1.4% have $R_X$ of greater than 30Ω. The maximum achievable −3 dB transmission bandwidth (limited by the voltage transfer between ports Y and X) for the nominal corner is ~500 MHz.

Figure 5:
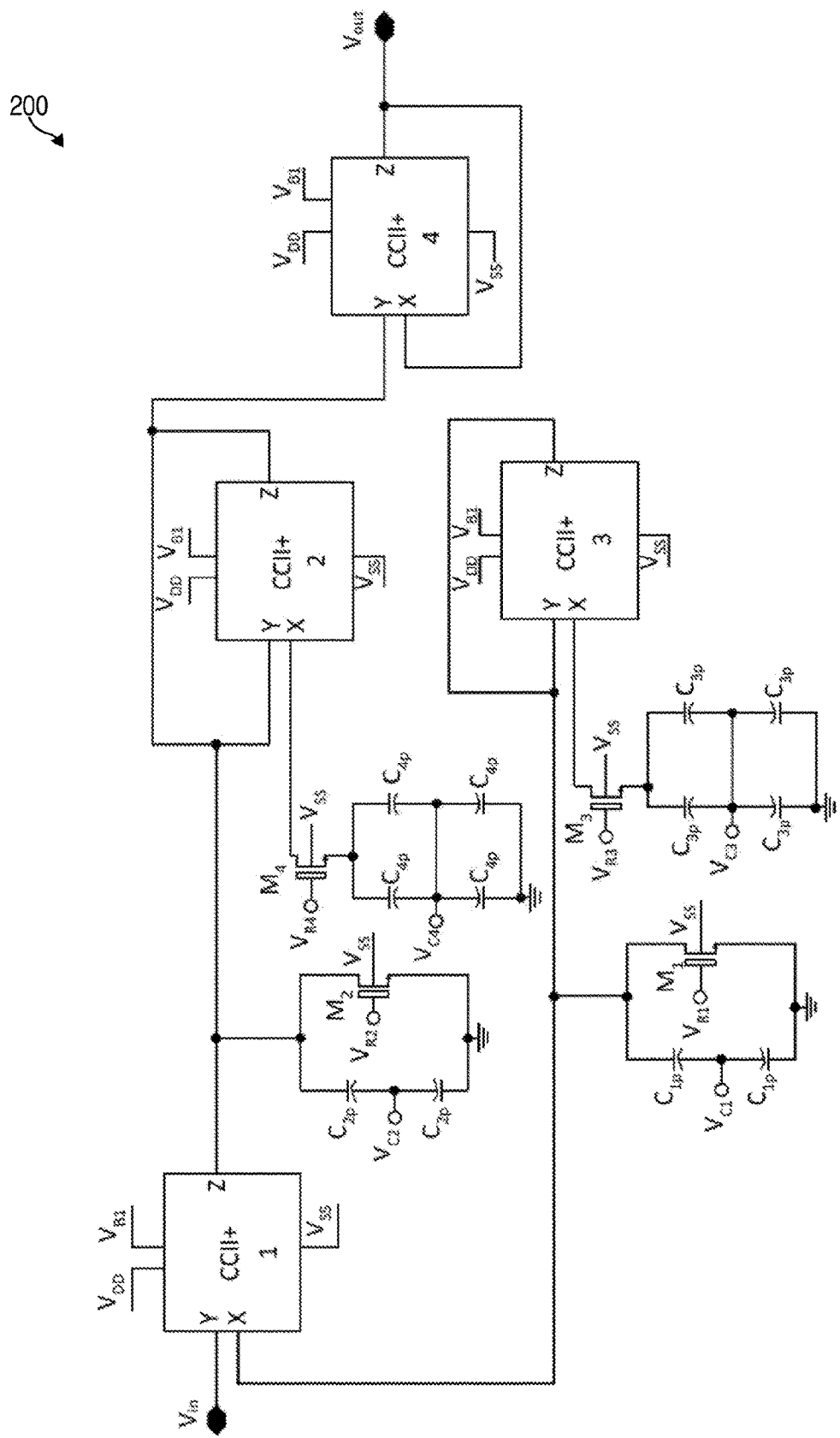
FIG. 5 shows a second embodiment of a second-order all-pass network comprising CCIIs, in accordance with the invention.
Figure 6A:
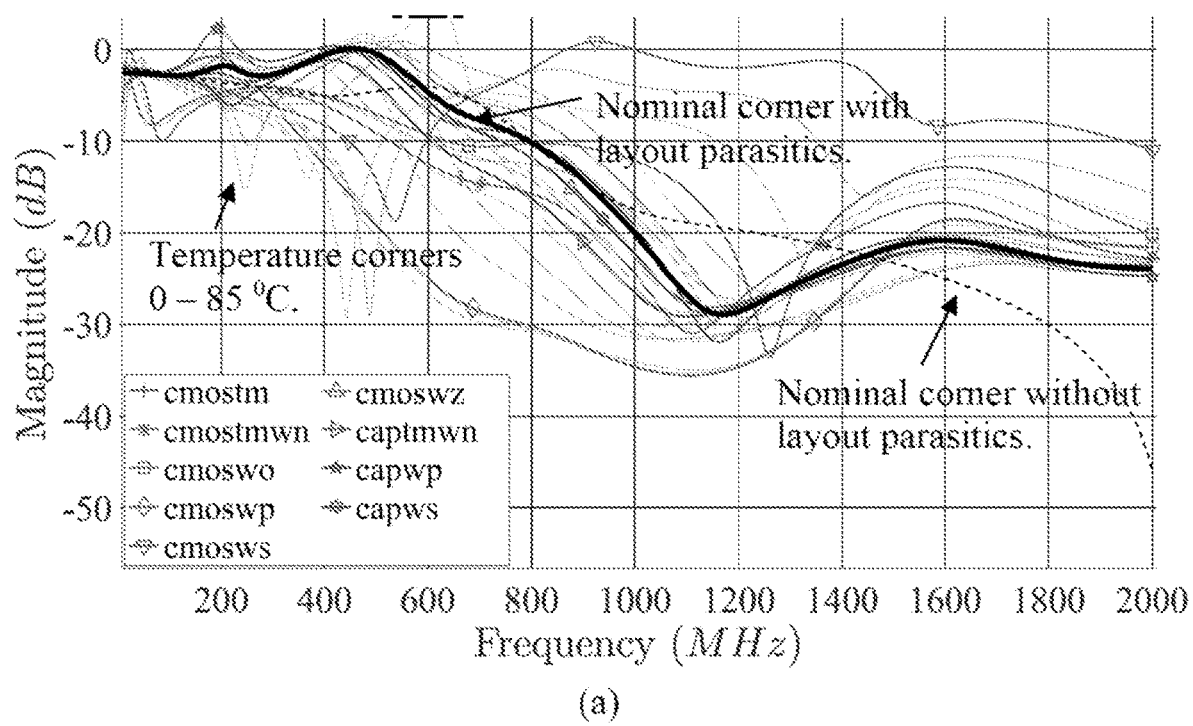
FIGS. 6a-6d show corner and Monte Carlo simulations of the second-order all-pass network of FIG. 5.
Figure 6B:
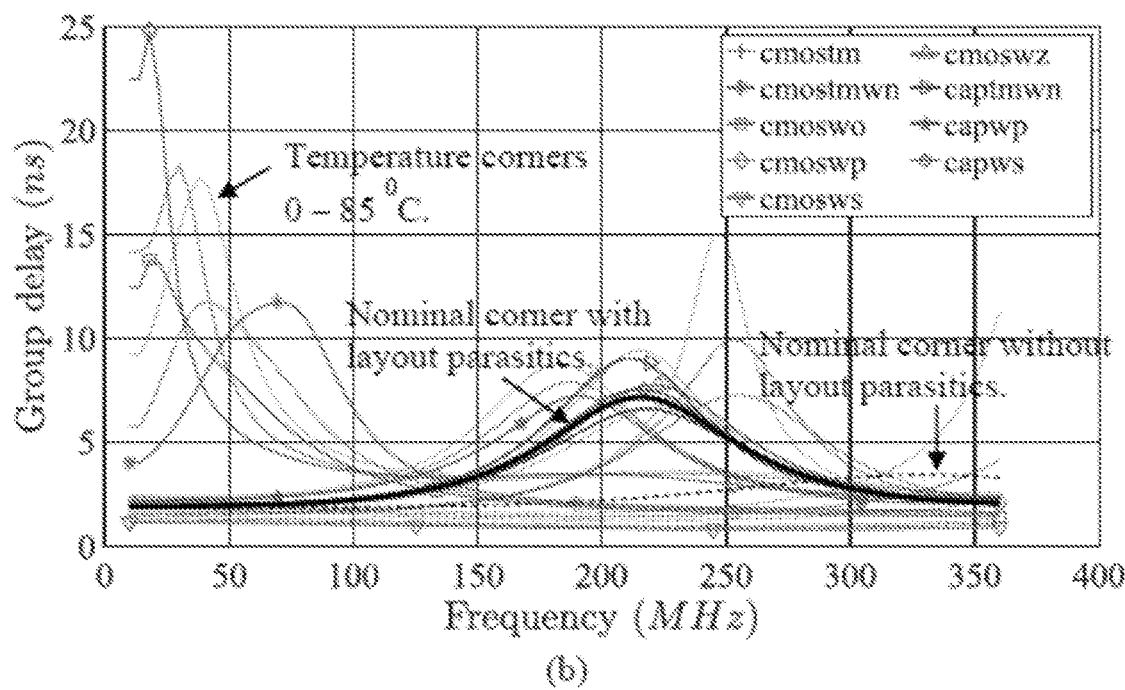
Figure 6C:
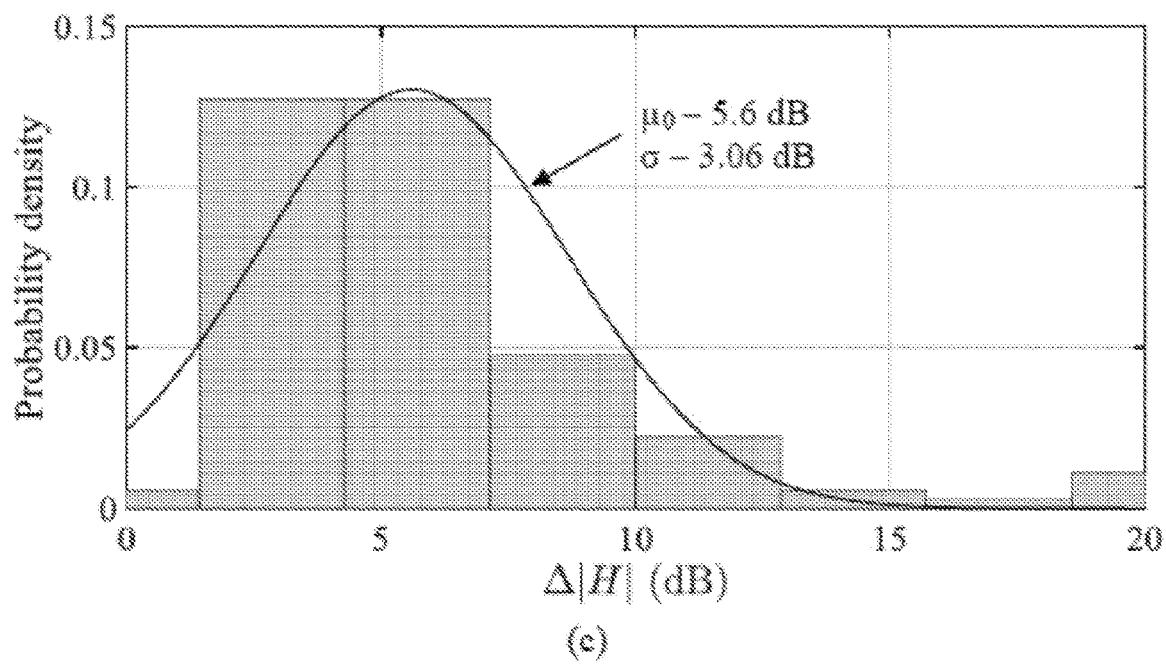
Figure 6D:
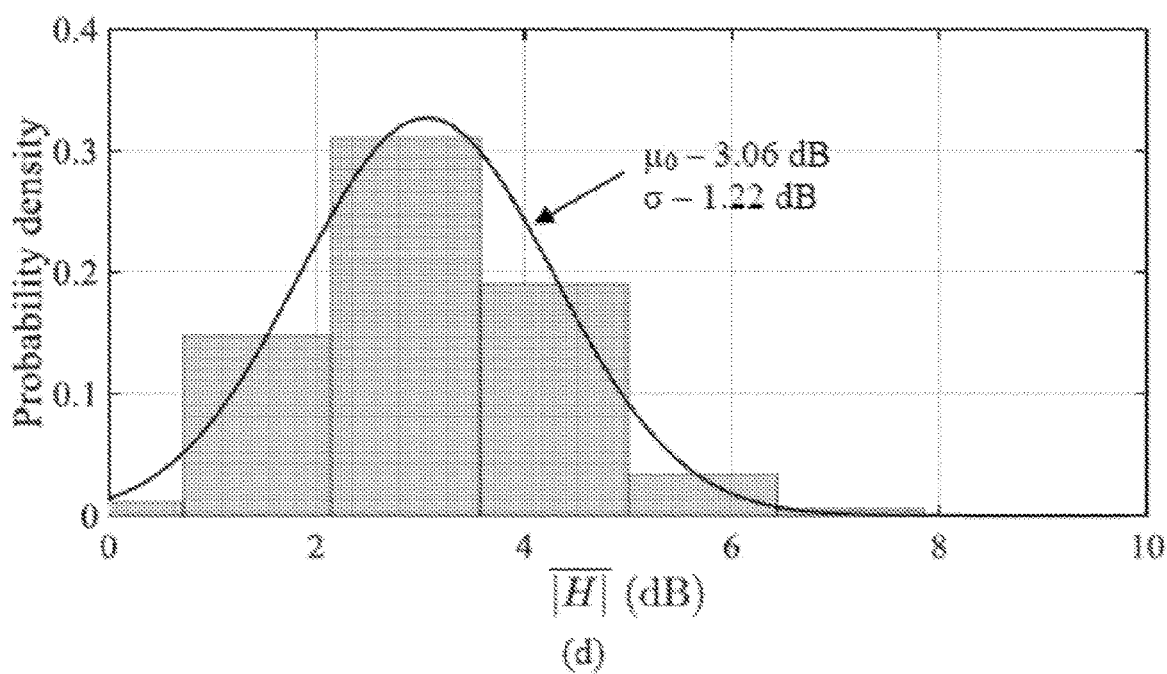

Having designed the CCII as in FIG. 4, the remainder of the proposed all-pass network is implemented as shown in FIG. 5, illustrated as a more development embodiment of a second-order all-pass network 200, in accordance with the invention. The following selection are made: $f_0$=200 MHz and Δτ=7 ns. Component values are then calculated using (10), with α chosen as 10$^{-3}$. Using the mean $A_v$ and $A_i$ from TABLE III, the synthesis results in $R_1$=1074Ω, $R_2$=1 kΩ, $R_3$=470Ω, $R_4$=695Ω, $C_1$=0.74 pF, $C_2$=0.80 pF, $C_3$=1.69 pF, $C_4$=1.15 pF. All resistors are implemented as NMOS devices operating in the triode region, where the bias voltages $V_{R1}$-$V_{R4}$ are chosen such that the effective channel resistance corresponds to $R_1$-$R_4$ above. The NMOS devices in FIG. 5 are chosen as (10 µm/0.5 µm) for $M_{1,2}$ and (20 µm/0.5 µm) for $M_{3,4}$, requiring nominal bias voltages of $V_{R1}$=1.943 V, $V_{R2}$=1.974 V, $V_{R3}$=1.952 V, $V_{R4}$=1.832 V.

Capacitors are implemented using accumulation-mode MOS varactors [35] which are tuned with gate bias voltages $V_{C1}$-$V_{C4}$ such that the effective capacitance values correspond to $C_1$-$C_4$ above. The peak capacitances of the varactors are chosen as $C_{1p}$=$C_{2p}$=1.8 pF and $C_{3p}$=$C_{4p}$=2.88 pF, allowing for a sufficient tuning range around the nominal values. Nominal bias voltages $V_{C1}$=−0.028 V, $V_{C2}$=−0.063 V, $V_{C3}$=0.107 V, $V_{C4}$=0.270 V are then required. Lastly, remaining bias values are set as in FIG. 4.

An additional voltage buffer stage (4th CCII+) is added to make the circuit capable of driving a 50Ω load impedance, as is required for the VNA measurement. A high-precision CCII as reported in [33] is used for this purpose.

After initial circuit synthesis and layout, a simulation of the proposed all-pass network 200 is performed using accurate non-ideal device models from the AMS foundry as well as extracted layout RC parasitics, as shown in FIGS. 6a-6d.

To compensate for the resulting change in circuit response, bias voltages are optimised (in simulation) using a global optimiser resulting in the solid black curve, as indicated. The optimised bias voltages are $V_{R1}$=2.009 V, $V_{R2}$=1.976 V, $V_{R3}$=2.052 V, $V_{R4}$=1.925 V, $V_{C1}$=0.027 V, $V_{C2}$=0.129 V, $V_{C3}$=0.156 V, $V_{C4}$=0.399 V, $V_{B1}$=−0.020 V. These values serve as the initial values for the automated tuning procedure during measurement. A corner simulation is also performed as indicated by the legend in FIGS. 6a-6b, with the temperature swept from 0-85° C. in each corner (as indicated by the dotted grey or lighter curves). This serves to illustrate the large variation in response characteristics that can be expected without post-production tuning. A Monte Carlo simulation of the full circuit, analysing Δ|H| and Δ|H̄| over 500 samples, indicates that a magnitude flatness of 5.6 dB is most likely, which further justifies the proposed post-production tuning approach.

Figure 7:
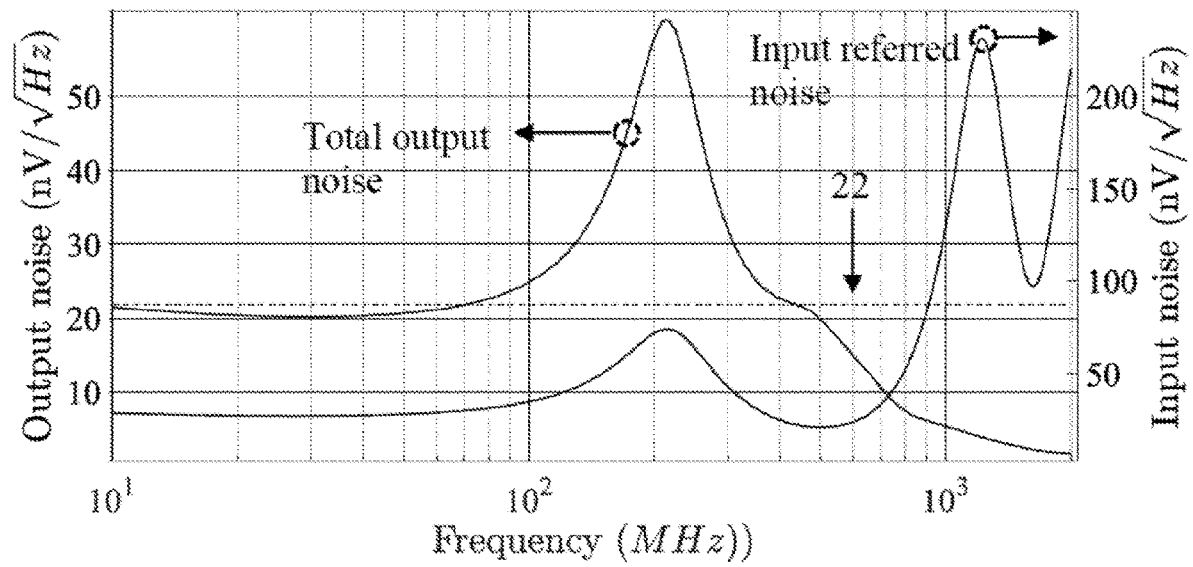
FIG. 7 shows a noise simulation of the all-pass network of FIG. 5.

The power consumption of the second-order all-pass network 200 is simulated to be 37 mW (15 mW without the voltage buffer). A noise simulation is also performed, as shown in FIG. 7, indicating a nominal output noise of 22 nV/√Hz, peaking at 62 nV/√Hz at resonance.

Figure 8:
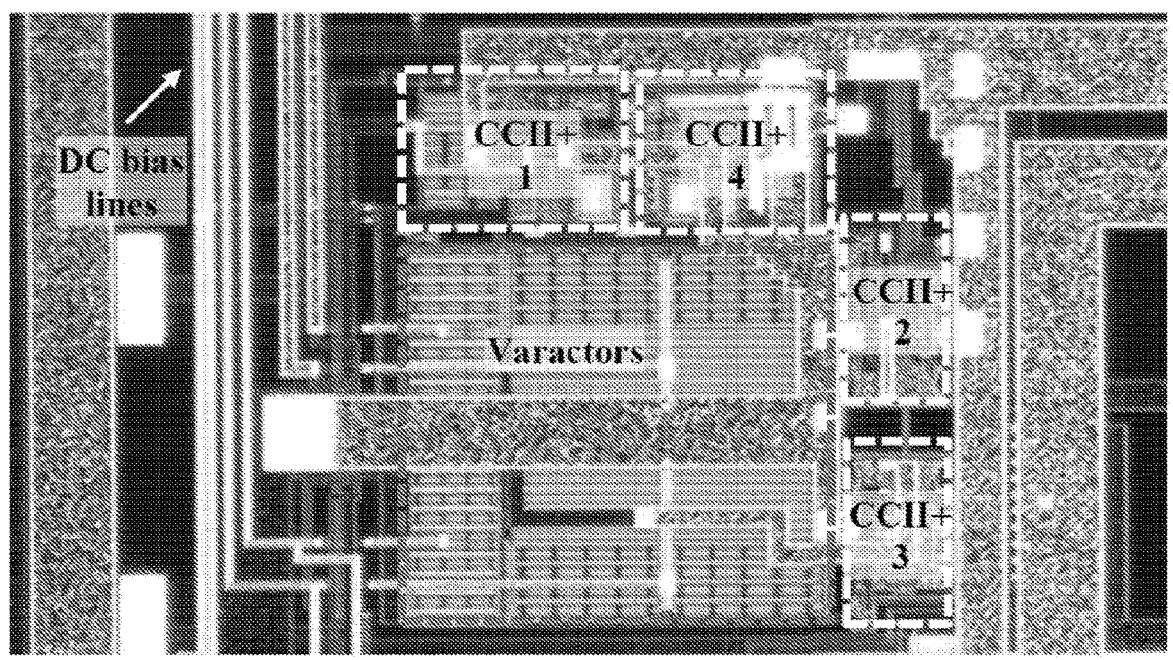
FIG. 8 shows a top view of a micrograph of the all-pass network of FIG. 5.
Figure 9:
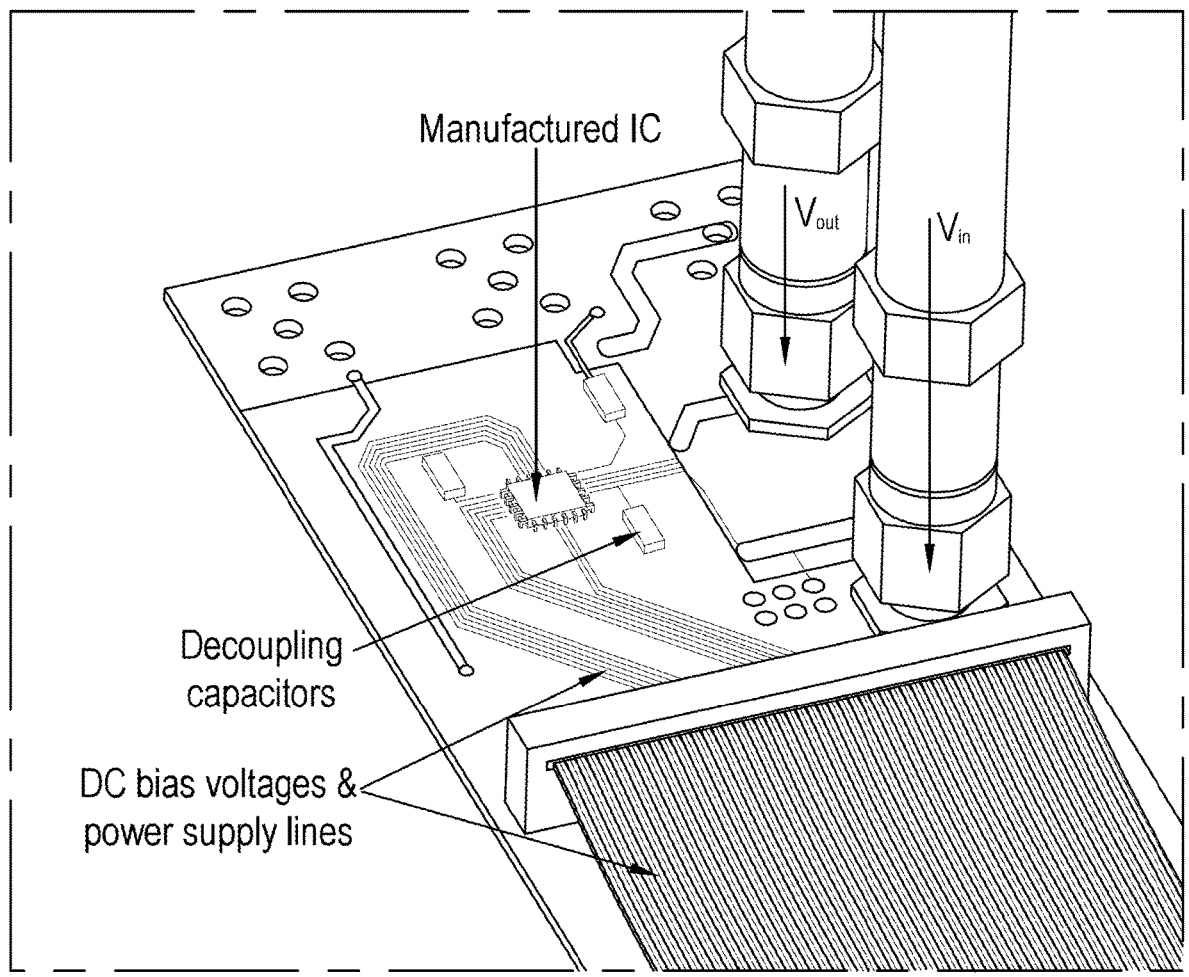
FIG. 9 shows a test PCB for housing and testing the all-pass network of FIG. 5.

The second-order all-pass network of FIG. 5 is manufactured using the C35B4 0.35 µm CMOS process from AMS, as shown in the micrograph of FIG. 8. A PCB (Printed Circuit Board) is also designed to house the IC (Integrated Circuit) and supply the necessary bias voltages and RF (Radio Frequency) test signals, as shown in FIG. 9. Bondwires are used to connect the IC to the PCB pads. Power supply and DC (Direct Current) bias voltages are supplied by an IDC (Insulation-Displacement Contact) connector. The $V_{in}$ and $V_{out}$ terminals are routed to SMA (Sub-Miniature version C) connectors, which are connected to an Anritsu MS4640A VNA for measurements. To ensure wideband operation, decoupling capacitors are placed as close to the IC as possible (less than λ/10 at 500 MHz).

Figure 10:
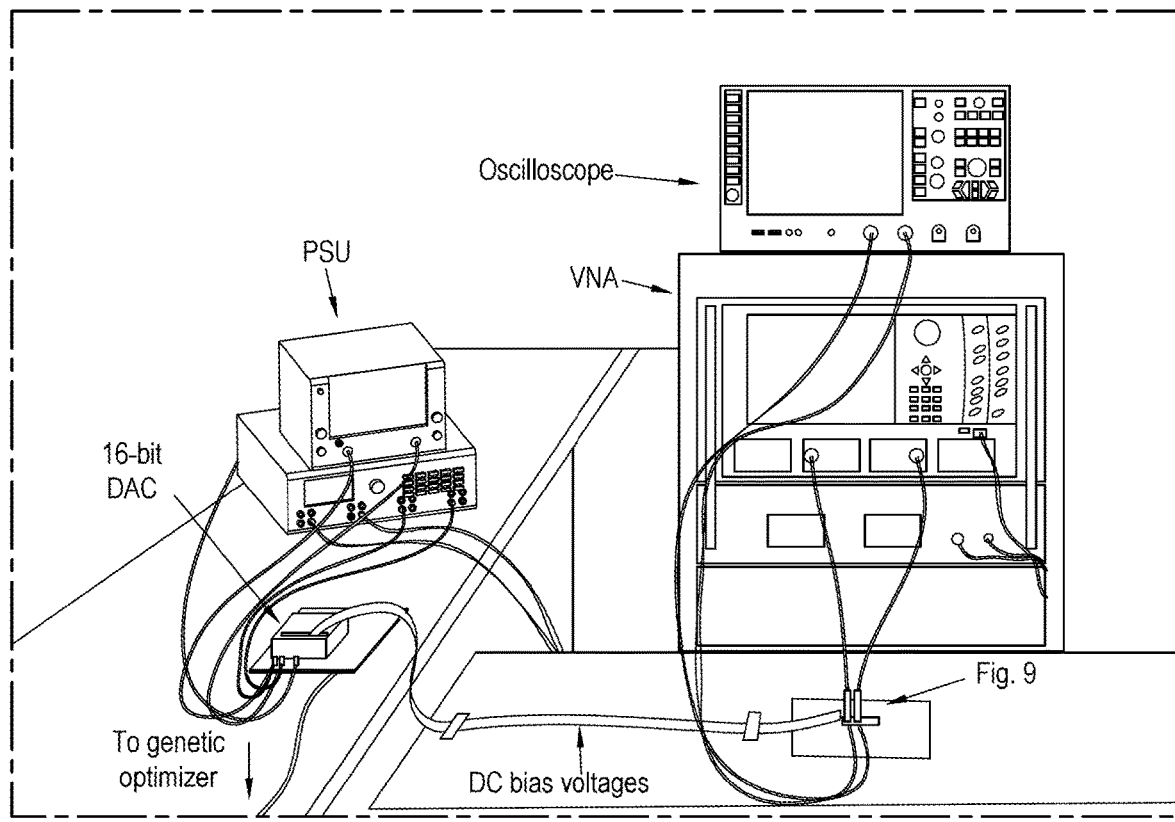
FIG. 10 shows a post-production measurement and genetic optimisation setup for the all-pass network of FIG. 5.

The overall measurement and post-production automated tuning setup is shown in FIG. 10. The pre-calibrated VNA captures 1001-point two-port S-parameter data and sends it to a computer running a genetic optimiser algorithm in MATLAB®. The optimiser code extracts the transmission magnitude and group delay response from the S-parameters, and calculates the required bias voltage settings for the next measurement iteration. These values are programmed to an Analog Devices AD5370 DAC card connected to the computer via USB (Universal Serial Bus), and then applied to the DUT. A 500 MHz bandwidth digital oscilloscope is also used to monitor the input and output excitations.

Figure 11A:
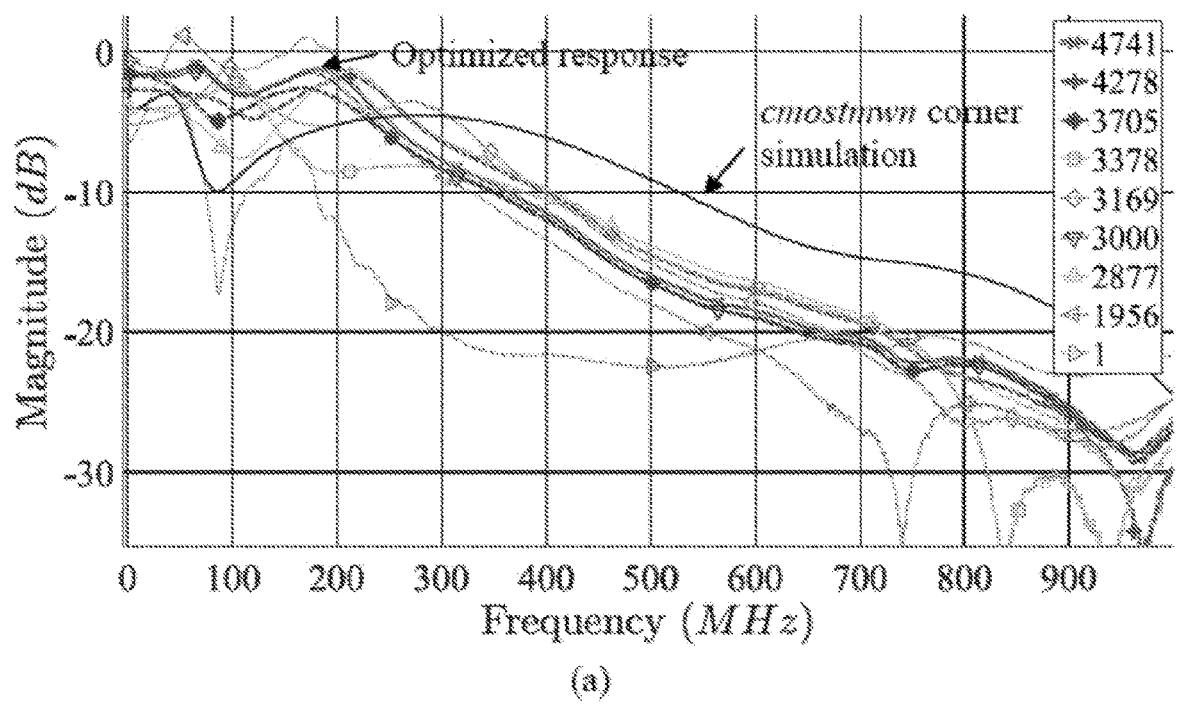
FIGS. 11a-11d show simulated or measured outputs of: (a) measured voltage transfer curve of the all-pass network of FIG. 5, (b) measured and simulated group delay curves of the all-pass network of FIG. 5, (c) various metrics used in the calculation of the objective function versus the iteration for the all-pass network of FIG. 5, and (d) overall objective function versus the iteration for the all-pass network of FIG. 5.
Figure 11B:
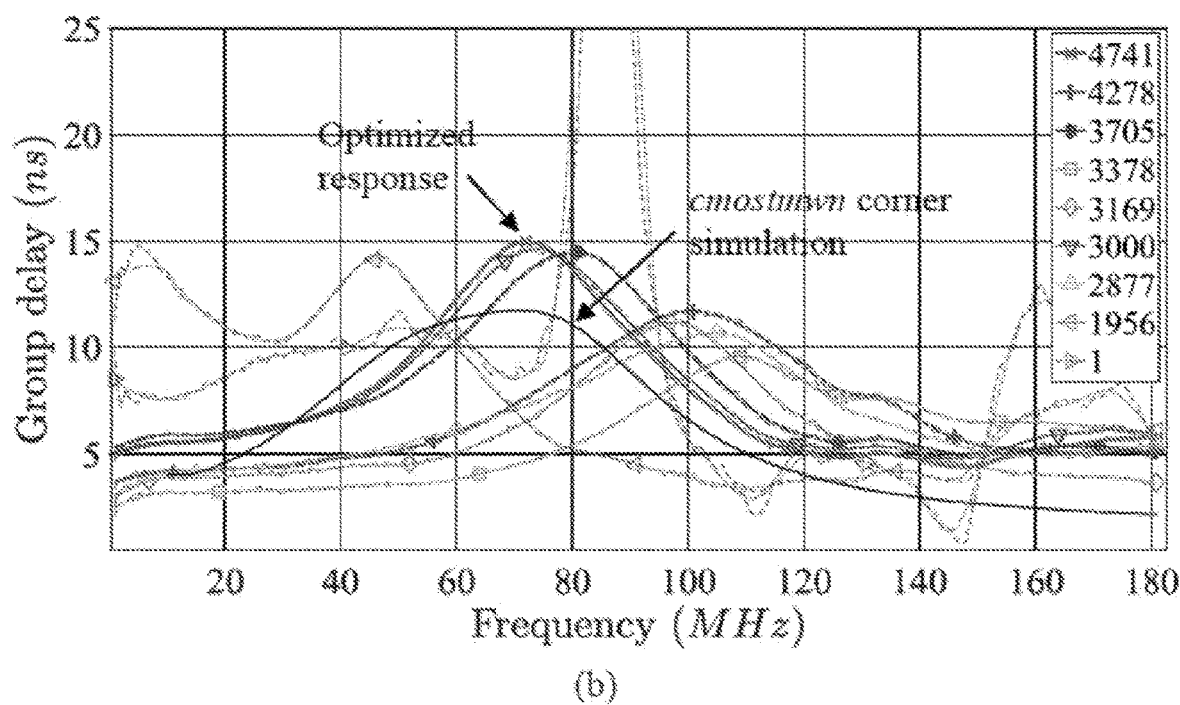

Measured results are shown in FIGS. 11a-11d versus the genetic optimiser iteration. This particular IC falls roughly into the cmostmwn corner (as shown in FIGS. 11a-11b)—resulting in a much lower bandwidth than predicted by nominal operating conditions. As expected from the corner simulations, the initial response is far from the desired all-pass response with a magnitude variation of ~15 dB. After running the optimiser for 4500 iterations, the magnitude variation is reduced to 3.1 dB with a −3 dB voltage transfer bandwidth of 280 MHz. The group delay $f_0$=73 MHz and Δτ=10 ns, giving a Q-value of 1.15.

Figure 11C:
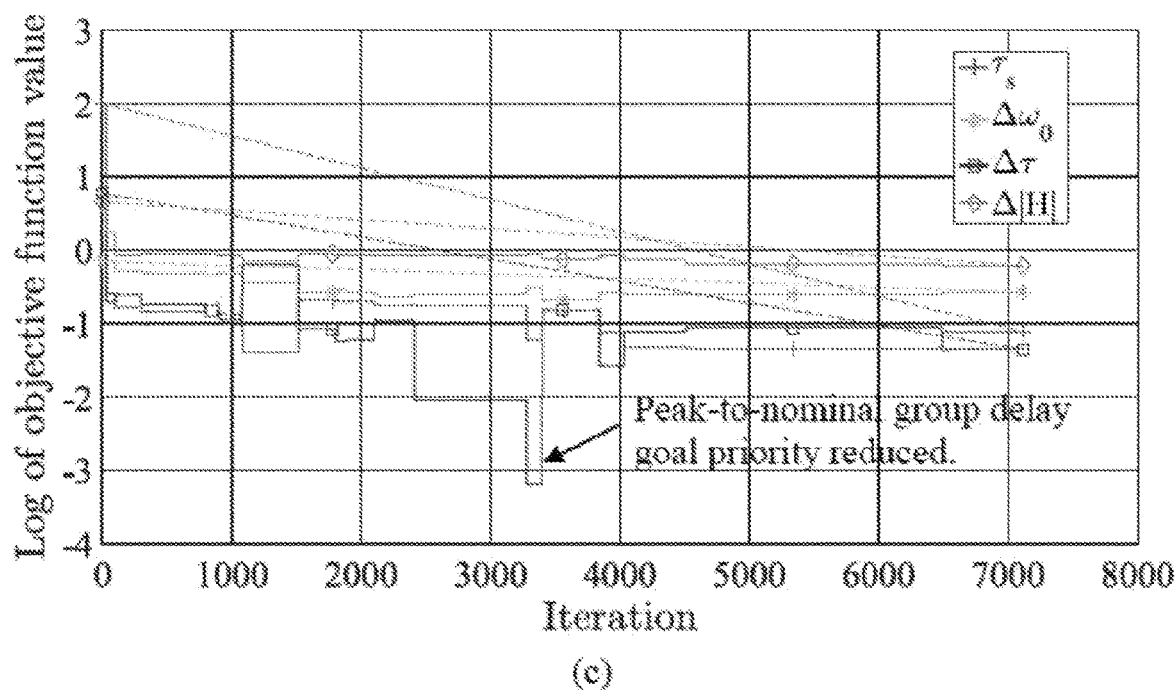
Figure 11D:
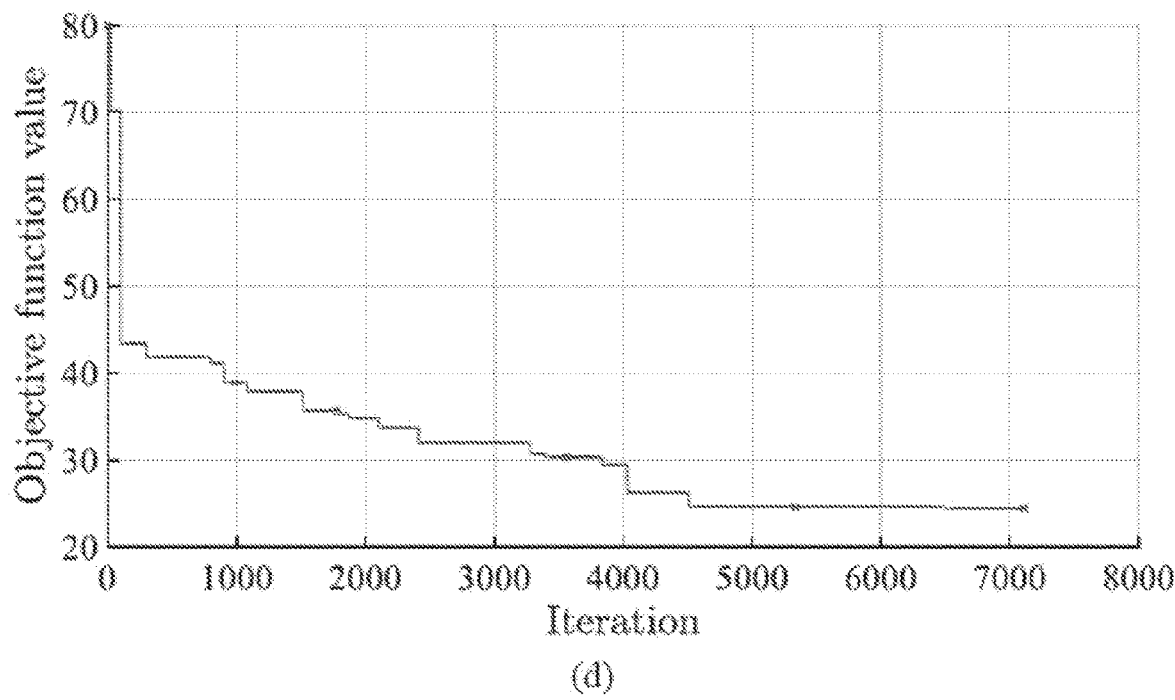
Figure 12:
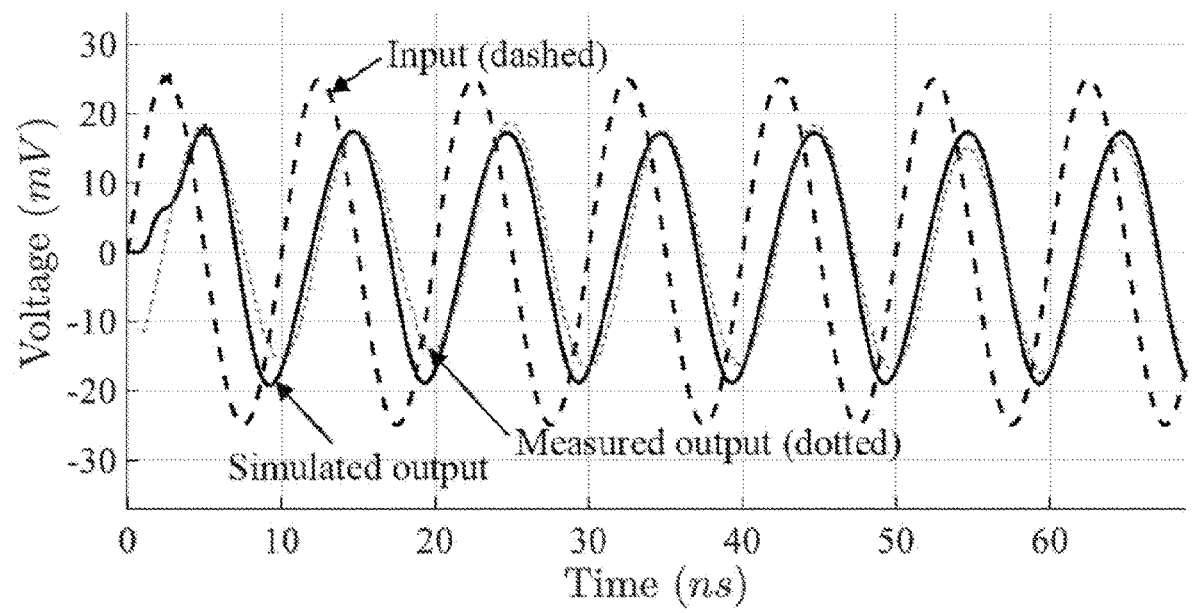
FIG. 12 shows measured input versus output sinusoid signals at 100 MHz, for the pass network of FIG. 5.

FIG. 11c shows the metrics used to calculate the overall objective function in FIG. 11d. The group delay similarity, $τ_s$, as defined earlier, turns out to be important in correctly guiding the genetic optimiser to the correct minimum. The overall objective function is then a simple linear superposition of these components.

A time-domain measurement of the optimised circuit's output for an input sinusoid of 100 MHz is shown in FIG.

12 (filtered with a digital low-pass filter to remove noise), further confirming correct operation of the proposed circuit. The good agreement between the measured and simulated responses in the cmostmwn corner is clear.

The Applicant believes that a novel on-chip active second-order all-pass network 100, 200 is disclosed. The all-pass network 200 has post-production tunability to account for CCII non-idealities as well as CMOS process tolerances. The benefits of the proposed design over existing methods are quantified by comparative simulation. The method is implemented in a 0.35 μm CMOS prototype design, and subjected to automated post-production tuning using a genetic local optimiser to realise a practical all-pass network. Good correspondence between simulated and measured responses is observed. This represents the first measured results of an active on-chip second-order all-pass network with a delay Q-value larger than 1 in published literature. A numerical comparison is provided in Table 4.

C-sections using predistortion with space mapping," IEEE Trans. Microw. Theory Tech., vol. 61, no. 12, pp. 4040-4051, 2013.

[7] R. Levy, "Realization of practical lumped element all-pass networks for delay equalization of RF and microwave filters," IEEE Trans. Microw. Theory Tech., vol. 59, no. 12, pp. 3307-3311, 2011.

[8] P. Aronhime, D. Nelson, J. Zurada, and C. Adams, "Realization of current-mode complex pole all-pass networks using a single current conveyor," in IEEE International Symposium on Circuits and Systems, 1990, pp. 3193-3196.

[9] P. Aronhime, "Realizations of complex pole all-pass networks," IEEE Trans. Circuits Syst., vol. 4, no. 22, pp. 324-328, 1975.

TABLE 4 comparison of present invention with published measured work.

| Ref. | Order | Q | $f_0$ (GHz) | −3 dB B/W (GHz) | Tech. | # of L | Size ($mm^2$) | Power (mW) | Magnitude variation (dB) |
|---|---|---|---|---|---|---|---|---|---|
| This invn | $2^{nd}$ | 1.15 | 0.073 | 0.280 | 0.35 μm CMOS | 0 | 0.0625 | 15 | 3.1 |
| [25] | $2^{nd}$ | 0.19 (0.59)*** | 3 | 4 | 0.25 μm CMOS | 0 | 0.085 | 30 | 1.5 (>25) |
| [23] | $2^{nd}$ | 0.08 (0.52) | 6 | 13 | 0.13 μm CMOS | 1 | 0.0627 | 18.5 | 0.5 (>13) |
| [26] | $2^{nd}$ | 0.071 | 6.5 | 16.5 | 0.09 μm CMOS | 0 | — | — | — |
| [27] | $2^{nd}$ | 0.049 (0.61) | 6.3 | 12 | 0.13 μm CMOS | 1 | — | 16.5 | 1.5 (>10) |
| [24] | $2^{nd}$ | 0.047 | 6 | 7.5 | SiGe BiCMOS HBT ($f_T$ = 95 GHz) | 1 | 0.49* | 121 | ~1 |
| [28] | $2^{nd}$ ($f_0$ = 0)** | 0 | 0 | 12.2 | 0.16 μm CMOS | 0 | 0.15 | 450 | 1.4 |
| [29] | $2^{nd}$ ($f_0$ = 0)** | 0 | 0 | 10 | SiGeRF HBT ($f_T$ = 80 GHz) | 2 | 0.4197 | 38.8 | 2-2.5 |
| [30] | $2^{nd}$ ($f_0$ = 0)** | 0 | 0 | 4.38 | 0.18 μm CMOS | 0 | 0.0512 | 16.79 | — |
| [31] | $2^{nd}$ ($f_0$ = 0)** | 0 | 0 | >3 | 0.13 μm CMOS | 0 | 0.29 | 112 | ~0.75 |

*Including pads
**constant delay with frequency
***values in brackets are computed over the entire bandwidth with the associated magnitude variation also shown in brackets.

REFERENCES

[1] S. Gupta, A. Parsa, E. Perret, R. V. Snyder, R. J. Wenzel, and C. Caloz, "Group-delay engineered noncommensurate transmission line all-pass network for analog signal processing," IEEE Trans. Microw. Theory Tech., vol. 58, no. 9, pp. 2392-2407, 2010.

[2] C. Caloz, S. Gupta, Q. Zhang, and B. Nikfal, "Analog signal processing: a possible alternative or complement to dominantly digital radio schemes," IEEE Microw. Mag., vol. 14, no. 6, pp. 87-103, 2013.

[3] L. Zou, S. Gupta, and C. Caloz, "Loss-gain equalized reconfigurable C-section analog signal processor," IEEE Trans. Microw. Theory Tech., vol. 65, no. 2, pp. 555-564, 2017.

[4] P. J. Osuch and T. Stander, "A geometric approach to group delay network synthesis," Radioengineering, vol. 25, no. 2, pp. 351-364, 2016.

[5] M. K. Mandal, D. Deslandes, and K. Wu, "Complementary microstrip-slotline stub configuration for group delay engineering," IEEE Microw. Wirel. Components Lett., vol. 22, no. 8, pp. 388-390, 2012.

[6] Q. Zhang, J. W. Bandler, and C. Caloz, "Design of dispersive delay structures (DDSs) formed by coupled

[10] G. Gupta, S. V. Singh, and S. V. Bhooshan, "VDTA based electronically tunable voltage-mode and trans-admittance biquad filter," Circuits Syst., vol. 93, no. 3, pp. 93-102, 2015.

[11] B. Nikfal, S. Gupta, and C. Caloz, "Increased group delay slope loop system for enhanced-resolution analog signal processing," IEEE Trans. Microw. Theory Tech., vol. 59, no. 6, pp. 1622-1628, 2010.

[12] P. Aronhime, "Transfer-function synthesis using a current conveyor," IEEE Trans. Circuits Syst., vol. 21, no. 2, pp. 312-313, 1974.

[13] A. Toker, M. Discigil, O. Cicekoglu, and H. H. Kuntman, "Direct synthesis approach for voltage mode transfer functions using current conveyors," IEEE Asia-Pacific Conf. Circuits Syst., pp. 255-258, 1998.

[14] C. M. Chang, "Multifunction biquadratic filters using current conveyors," IEEE Trans. Circuits Syst. II Analog Digit. Signal Process., vol. 44, no. 11, pp. 956-958, 1997.

[15] J. W. Horng, "Voltage-mode universal biquadratic filters using CCIIs," IEICE Trans. Fundam. Electron. Commun. Comput. Sci., vol. E87-A, no. 2, pp. 406-409, 2004.

[16] M. C. Chang, "Universal voltage-mode filter with four inputs and one output using two CCII's," Int. J. Electron., vol. 86, no. 3, pp. 305-309, 1999.

[17] S.-I. Liu and J.-L. Lee, "Voltage-mode universal filters using two current conveyors," Int. J. Electron., vol. 82, no. 2, pp. 145-150, 1997.

[18] J. W. Horng, M. H. Lee, H. C. Cheng, and C. W. Chang, "New CCII-based voltage-mode universal biquadratic filter," Int. J. Electron., vol. 82, no. 2, pp. 151-156, 1997.

[19] J.-W. Horng, "Novel universal voltage-mode biquad filter with three inputs and one output using only two current conveyors," Int. J. Electron., vol. 80, no. 4, pp. 543-546, 1996.

[20] S. Özoğuz and E. O. Günes, "Universal filter with three inputs using CCII+," Electron. Lett., vol. 32, no. 23, p. 2134, 1996.

[21] C. Chang and M. S. Lee, "Universal voltage-mode filter with three inputs and one output using three current conveyors and one voltage follower," Electron. Lett., vol. 30, no. 25, pp. 2112-2113, 1994.

[22] C. M. Chang and M. S. Lee, "Comment: universal voltage-mode filter with three inputs and one output using three current conveyors and one voltage follower," Electron. Lett., vol. 31, no. 5, p. 353, 1995.

[23] P. Ahmadi, B. Maundy, A. S. Elwakil, L. Belostotski, and A. Madanayake, "A new second-order all-pass filter in 130-nm CMOS," IEEE Trans. Circuits Syst. II Express Briefs, vol. 63, no. 3, pp. 249-253, 2016.

[24] M. Hamouda, G. Fischer, R. Weigel, and T. Ussmueller, "A compact analog active time delay line using SiGe BiCMOS technology," in 2013 IEEE International Symposium on Circuits and Systems (ISCAS2013), 2013, pp. 1055-1058.

[25] X. Lin, J. Liu, H. Lee, and H. Liu, "A 2.5- to 3.5-Gb/s adaptive FIR equalizer with continuous-time wide-bandwidth delay line in 0.25-μm CMOS," IEEE J. Solid-State Circuits, vol. 41, no. 8, pp. 1908-1918, 2006.

[26] M. Maeng et al., "0.18-μm CMOS equalization techniques for 10-Gb/s fiber optical communication links," IEEE Trans. Microw. Theory Tech., vol. 53, no. 11, pp. 3509-3519, 2005.

[27] P. Ahmadi, M. H. Taghavi, L. Belostotski, and A. Madanayake, "10-GHz current-mode 1st and 2nd order allpass filters on 130 nm CMOS," in IEEE 56th International Midwest Symposium on Circuits and Systems (MWSCAS), 2013, pp. 1-4.

[28] S. K. Garakoui, E. A. Klumperink, B. Nauta, and F. E. van Vliet, "Compact cascadable gm-C all-pass true time delay cell with reduced delay variation over frequency," IEEE J. Solid-State Circuits, vol. 50, no. 3, pp. 693-703, 2015.

[29] A. Q. Ulusoy, B. Schleicher, and H. Schumacher, "A tunable differential all-pass filter for UWB true time delay and phase shift applications," IEEE Microw. Wirel. Components Lett., vol. 21, no. 9, pp. 462-464, 2011.

[30] Y. W. Chang, T. C. Yan, and C. N. Kuo, "Wideband time-delay circuit," in 2011 European Conference In Microwave Integrated Circuits (EuMIC), 2011, no. October, pp. 454-457.

[31] I. Mondal and N. Krishnapura, "A 2-GHz bandwidth, 0.25-1.7 ns true-time-delay element using a variable-order all-pass filter architecture in 0.13 μm CMOS," IEEE J. Solid-State Circuits, vol. 52, no. 8, pp. 2180-2193, 2017.

[32] P. J. Osuch and T. Stander, "An on-chip post-production tunable group delay equaliser," Int. Conf. Actual Probl. Electron Devices Eng. APEDE 2014, vol. 1, pp. 177-184, 2014.

[33] P. J. Osuch and T. Stander, "Wideband high-precision CMOS CCII+ with stability and peaking control," IEEE J. Solid-State Circuits, 2017 (submitted).

[34] S. Ben Salem, M. Fakhfakh, D. S. Masmoudi, M. Loulou, P. Loumeau, and N. Masmoudi, "A high performances CMOS CCII and high frequency applications," Analog Integr. Circuits Signal Process., vol. 49, no. 1, pp. 71-78, 2006.

[35] H. Ramiah and T. Z. Zulkifli, "Design and optimization of integrated MOS varactors for high-tunability RF circuits," IETE J. Res., vol. 57, no. 4, pp. 346-350, 2011.

The invention claimed is:

1. A second-order all-pass network comprising:
at least three Second Generation Current Conveyors (CCIIs), namely a first CCII, a second CCII, and a third CCII, wherein:
a network input is connected or connectable to a Y port of the first CCII;
a Z port of the first CCII is connected to a Y port of the second CCII;
an X port of the first CCII is connected to a Y port of the third CCII; and
a network output is connected or connectable, directly or indirectly, to a Z port of the second CCII, and
a plurality of network elements, wherein:
the X port of the first CCII is connected via a first network element to ground;
the Z port of the first CCII is connected via a second network element to ground;
an X port of the third CCII is connected via a third network element to ground; and
an X port of the second CCII is connected via a fourth network element to ground.

2. The second-order all-pass network as claimed in claim 1, which is inductorless.

3. The second-order all-pass network as claimed in claim 1, which has a Q-value larger than 1.

4. The second-order all-pass network as claimed in claim 1, wherein the Y port of the second CCII is connected to the Z port of the second CCII.

5. The second-order all-pass network as claimed in claim 1, wherein the Y port of the third CCII is connected to the Z port of the third CCII.

6. The second-order all-pass network as claimed in claim 1, wherein one or more of the network elements comprise an RC (Resistor-Capacitor) network.

7. The second-order all-pass network as claimed in claim 6, wherein the RC network is a parallel RC network or a series RC network.

8. The second-order all-pass network as claimed in claim 6, wherein a resistor component in the RC network is implemented by an NMOS transistor.

9. The second-order all-pass network as claimed in claim 8, wherein the NMOS transistor is operated in a triode region.

10. The second-order all-pass network as claimed in claim 9, wherein operating in the triode region provides post-production tunability.

11. The second-order all-pass network as claimed in claim 6, wherein a capacitor component in the RC network is implemented by a varactor.

12. The second-order all-pass network as claimed in claim 1, which is implemented in a CMOS process.

13. The second-order all-pass network as claimed in claim 12, wherein the network elements are on-chip.

14. The second-order all-pass network as claimed in claim 12, wherein the network elements are tunable to compensate for CMOS process tolerances.

15. The second-order all-pass network as claimed in claim 1, comprising a fourth CCII.

16. The second-order all-pass network as claimed in claim 15, wherein the fourth CCII is configured for post-production tunability or wherein the fourth CCII enables post-production tunability of the second-order all-pass network.

17. The second-order all-pass network as claimed in claim 15, wherein a Y port of the fourth CCII is connected to the Z port of the second CCII.

18. The second-order all-pass network as claimed in claim 15, wherein a Z port of the fourth CCII is connected or connectable to the network output, the Z port of the third CCII thus being indirectly connected to the network output via the fourth CCII.

19. The second-order all-pass network as claimed in claim 18, wherein an X port of the fourth CCII is connected to the Z port of the fourth CCII.

20. A method of tuning the second-order all-pass network as claimed in claim 1, the method comprising tuning one or more of the network elements.

21. The method as claimed in claim 20, wherein the tuning the one or more of the network elements comprises iterative tuning passes in accordance with a pre-defined optimizer algorithm.

* * * * *